United States Patent
Riley et al.

(12) 
(10) Patent No.: US 6,399,510 B1
(45) Date of Patent: Jun. 4, 2002

(54) BI-DIRECTIONAL PROCESSING CHAMBER AND METHOD FOR BI-DIRECTIONAL PROCESSING OF SEMICONDUCTOR SUBSTRATES

(75) Inventors: Norma B. Riley, Pleasanton; Roger N. Anderson, Sunnyvale; Grant D. Imper, San Jose; Paul Comita, Menlo Park, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/660,001

(22) Filed: Sep. 12, 2000

(51) Int. Cl.[7] ............................................. H01L 21/00
(52) U.S. Cl. ..................... 438/710; 156/345; 216/58; 458/708; 458/710
(58) Field of Search ................. 438/710, 708, 438/714, 727, 730; 216/58, 67; 156/345, 345 V, 345 P

(56) References Cited

U.S. PATENT DOCUMENTS

| | | | |
|---|---|---|---|
| 4,048,955 A | | 9/1977 | Anderson |
| 4,563,367 A | * | 1/1986 | Sherman ................... 216/67 X |
| 4,738,748 A | * | 4/1988 | Kisa ..................... 204/92.32 X |
| 5,945,008 A | * | 8/1999 | Kisakibaru et al. ..... 438/729 X |

* cited by examiner

Primary Examiner—William A. Powell
(74) Attorney, Agent, or Firm—Blakely Sokoloff Taylor & Zafman

(57) ABSTRACT

A semiconductor substrate processing chamber provides a bi-directional process gas flow for deposition or etching processes. The bi-directional gas flow provides uniformity of deposition layer thickness or uniformity of etching without the need to rotate the substrate. Junctions are provided at opposite ends of a processing chamber. Inlet and outlet ports are provided on each junction. Inlet and outlet ports on opposite junctions cooperate to provide a gas flow in a first direction for half of the process cycle, and in a second direction for the other half of the process cycle.

28 Claims, 20 Drawing Sheets

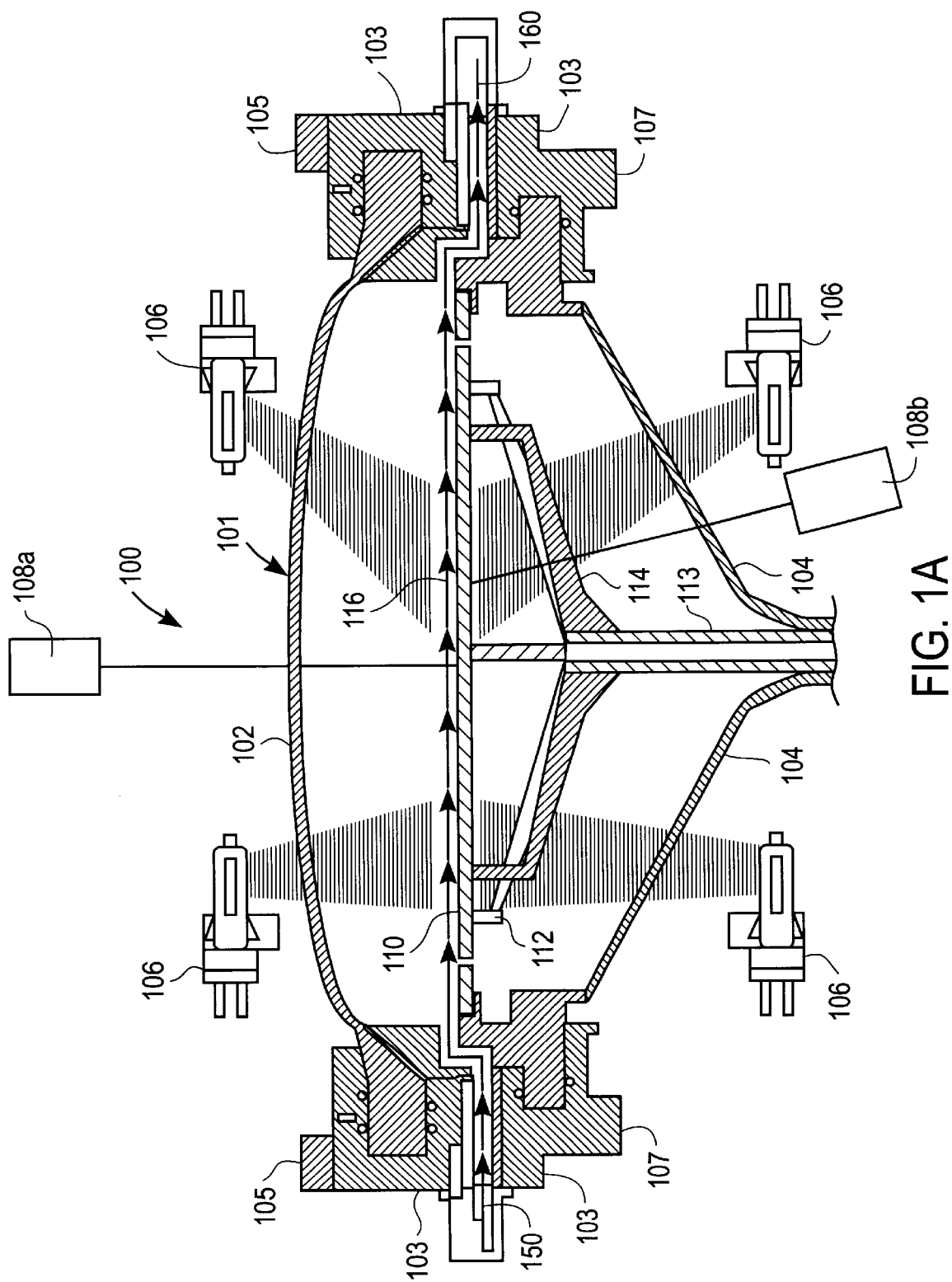

BI-DIRECTIONAL PROCESSING CHAMBER AND METHOD FOR BI-DIRECTIONAL PROCESSING OF SEMICONDUCTOR SUBSTRATES

FIELD OF THE INVENTION

The present invention relates generally to the field of substrate processing for semiconductor manufacturing and, more specifically, to an apparatus and a method that improve uniformity of deposition or etching of films on the substrate by providing bi-directional gas flow.

BACKGROUND OF THE INVENTION

An important part of integrated circuit manufacturing is the processing of the semiconductor substrate in which active devices such as transistors and capacitors that comprise the integrated circuits are formed. Processing of the substrate includes, for example, growth of an epitaxial silicon or polysilicon layer or film, the formation of a thermal oxide or thermal nitride layer over silicon, or etching of portions of previously deposited layers. These exemplary processes, among others, are typically performed in thermal deposition or etch process chambers. Process chambers typically include a platform such as a susceptor or an edge ring, a substrate support mechanism, a quartz housing or cover, and heat lamps that provide heat energy to the substrate being processed.

Deposition and etching are typically performed in these types of chambers by flowing a process gas through the chamber and over the substrate, which is resting on the platform in the chamber. The substrate and the process gas are heated during the processing. The gas includes the chemical species that react at the wafer surface to deposit or etch the layers of material on the substrate. The process chamber typically includes a gas inlet port and a gas outlet port.

Deposition and etch process chambers are normally designed such that the process gas flows over the substrate and from one side of the chamber to the other. The chemical species react at the wafer surface, which results in a change in gas composition (i.e., depletion of the gas species) in the direction of gas flow. For this reason, some chambers are provided with a mechanism to rotate the wafer holder that carries the substrate so that the reaction rate at the surface of the substrate is averaged out to provide uniformity of deposition or etching along the entire surface. Another technique that is an attempt to achieve greater uniformity of deposition or etching by overcoming the depletion phenomenon is to inject the gas stream into the chamber such that a mixing of the gas occurs which averages out the deposition or etch rate. Another technique is to tilt the wafer support, which allows "fresh" gas to arrive at the wafer surface as the gas travels across the wafer.

FIG. 1A shows an example of a chamber 100 that can be used to process semiconductor substrates. Chamber 100 includes an enclosure 101 that has a top housing 102 and a bottom housing 104, which are typically made of quartz. Platform 110 is located within the chamber 100. Platform 110 typically defines a pocket (not shown) for holding a semiconductor substrate (not shown) to be processed. Lamps 106 are located outside of the top housing 102 and the bottom housing 104. Lamps 106 are typically arranged in an array (not shown). Lamps 106 provide heat energy to the chamber, and thus to the substrate, during processing of the substrate. Pyrometers 108a and 108b are positioned above and below enclosure 101. Pyrometer 108a measures the temperature of the substrate being processed, while pyrometer 108b measures the temperature of the platform 110 on which the substrate rests. Platform 110 is supported by platform support 112. Platform support 112 is typically configured so that it can rotate the platform 110 during processing of the substrate. Substrate lift pins 114 are located below the platform 110 and extend upwardly through apertures (not shown) in platform 110. Substrate lift pins 114 lift the substrate either at its edge or at its bottom surface during loading and unloading of the substrate into and out of the chamber.

As shown in FIG. 1B, chamber 100 includes a base ring 103 surrounding enclosure 101. Base ring 103 can be generally rectangular in shape with the circular enclosure 101 having a dome-shaped top housing 102 mounted within base ring 103. Referring again to FIG. 1A, a gas inlet 150 and a gas outlet 160 are usually provided at diametrically opposed locations on base ring 103. Arrows 116 illustrate the direction of the gas flow across the platform 110 from gas inlet 150 to gas outlet 160. A clamp ring 105 can be provided to seal the top housing 102 to the base ring 103. A second damp ring 107 can be provided to seal the bottom housing 104 to the base ring 103.

Because the process gas of chamber 100 flows in one direction, the substrate being processed must be rotated to average out the depletion or etch rate of the gas as it travels across the substrate in the direction of arrows 116. Platform 110 is typically rotated as it carries the substrate. Platform support 112 includes an axle 113 that is connected to a motor (not shown) to provide the rotation. A rotating platform adds complexity and cost to the chamber 100 because the substrate must remain as level as possible as it rotates so as to achieve a uniform deposition or etch rate. Any wobbling or eccentricity of the platform 110 can result in uneven deposition or etching, which can ultimately result in waste of a substrate. Processing chamber 100 can be greatly improved by eliminating sources of potential error in the process such as the mechanisms that rotate the substrate and platform 110.

SUMMARY OF THE INVENTION

In one embodiment, a semiconductor substrate processing chamber includes an enclosure having a first junction and a second junction. A first gas inlet port is at the first junction. A first gas outlet port is at the second junction. A second gas inlet port is also at the second junction, and a second gas outlet port is at the first junction.

The first gas inlet port and the first gas outlet port cooperate to provide gas flow in a first direction, while the second gas inlet port and the second gas outlet port cooperate to provide gas flow in a second direction.

BRIEF DESCRIPTION OF THE DRAWINGS

The present invention is illustrated by way of example, and not limitation, in the figures of the accompanying drawings in which:

FIG. 1A is a side cross-sectional view of a semiconductor substrate processing chamber;

DETAILED DESCRIPTION

An embodiment of a semiconductor substrate thermal processing chamber provides process gas flow in one direction for half of the process cycle and in the reverse direction for the other half of the process cycle. The flow in the process chamber is a structured flow such that the depletion of reactant is linear in the flow direction. The sum of the two flow directions produces a uniform layer thickness. This configuration eliminates the need for rotating or moving the wafer, which also simplifies and reduces the cost of the chamber. This invention provides another way of obtaining deposition or etching uniformity without the use of rotation or mixing.

Figure 1B:
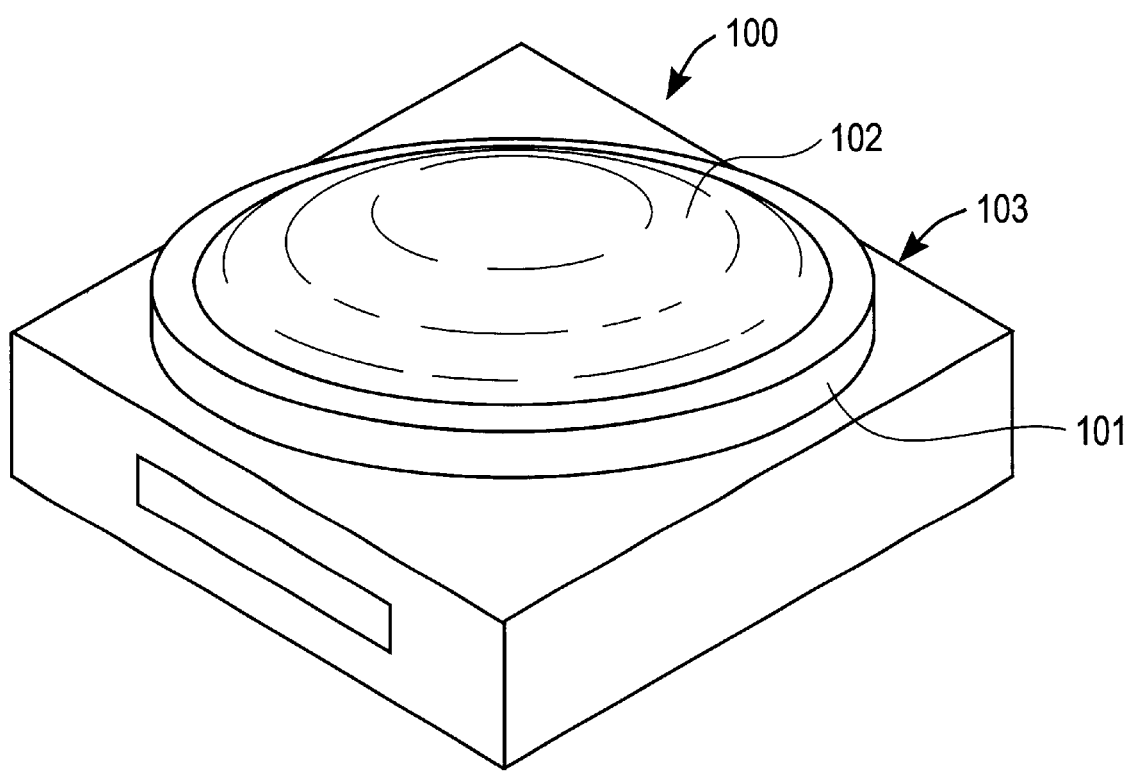
FIG. 1B is a perspective view of the processing chamber of FIG. 1A.
Figure 2:
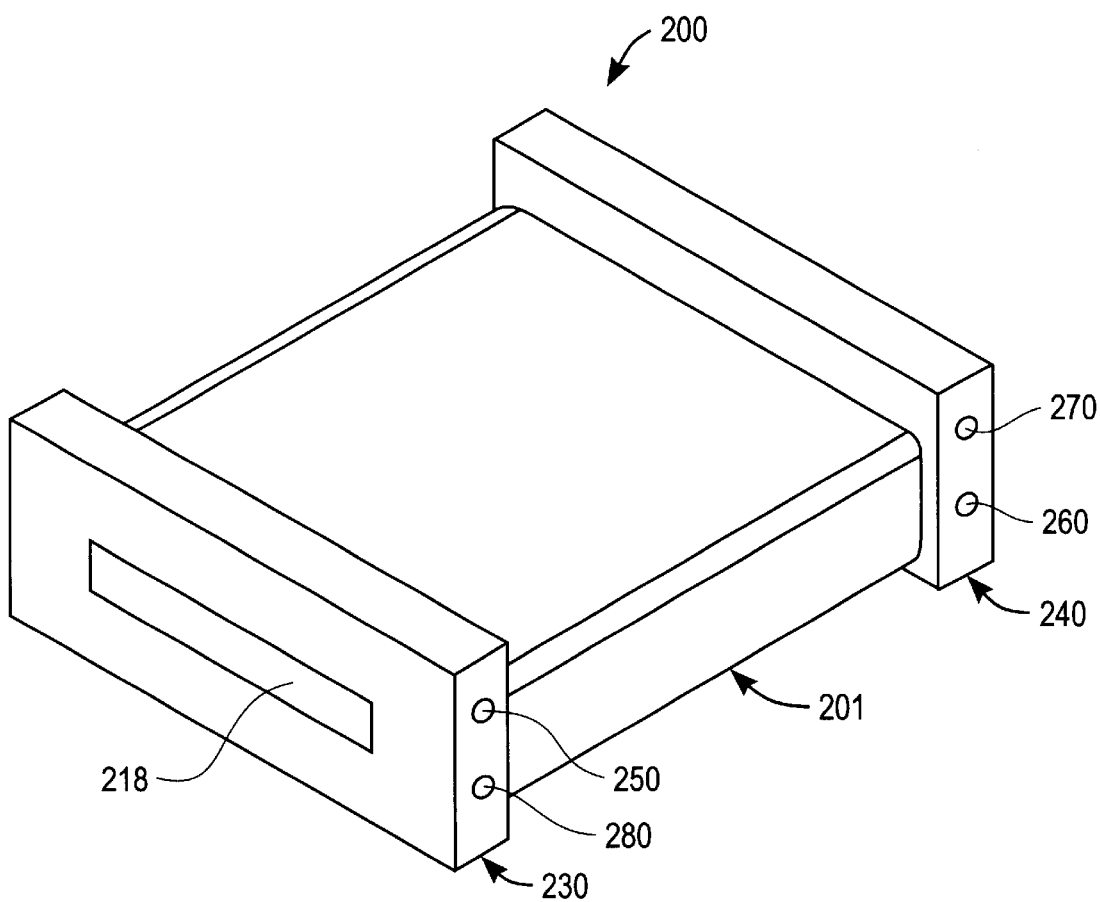
FIG. 2 is a perspective view of an embodiment of a bi-directional processing chamber.

FIG. 2 shows a simplified perspective view of an embodiment of a bi-directional processing chamber 200. Processing chamber 200 includes an enclosure 201, preferably made of quartz. Enclosure 201 is a generally rectangular, tubular structure. A first junction 230 is provided at one end of the enclosure 201 and a second junction 240 is provided at the opposite end. Each junction allows for both injection and exhaust of process gasses. Gasses can be injected through first inlet port 250 or second inlet port 270 and can be exhausted through first outlet port 260 or second outlet port 280, as described in further detail below. Junctions 230 and 240 can be made of stainless steel. An o-ring seal can be provided between the junctions 230 and 240 and the quartz enclosure 201. Substrate passage 218 is shown on first junction 230 in FIG. 2.

Figure 3:
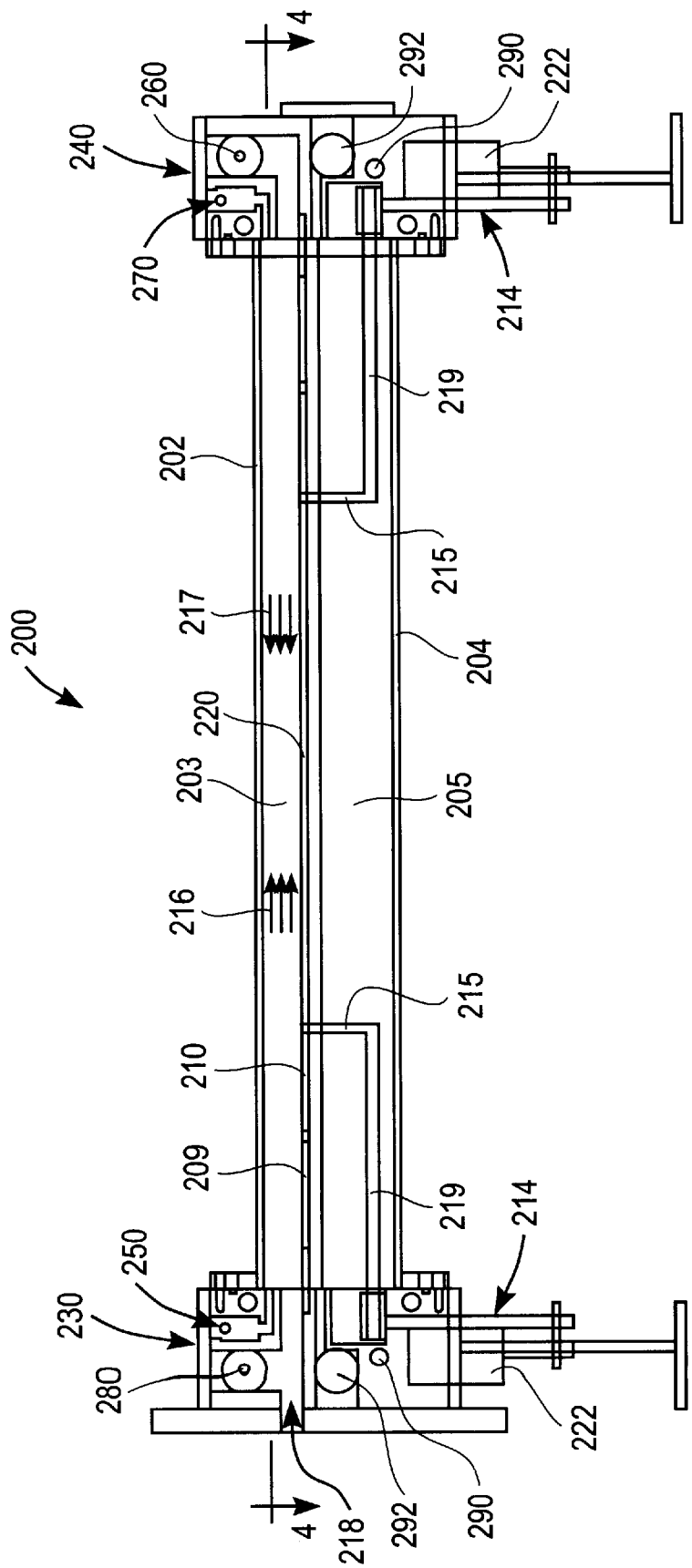
FIG. 3 is a side cross-sectional view of an embodiment of a bi-directional processing chamber.

FIG. 3 shows first junction 230 at the leftmost end of the side view of chamber 200 depicted in FIG. 3, and second junction 240 is shown at the rightmost end. First junction 230 includes first inlet port 250 and second junction 240 includes first outlet port 260. First inlet port 250 cooperates with first outlet port 260 to provide a gas flow in a first gas flow direction illustrated by arrows 216. A second inlet port 270 is at second junction 240. A second outlet port 280 is at first junction 230. The second inlet port 270 cooperates with the second outlet port 280 to provide a second gas flow direction illustrated by the arrows 217.

The chamber is operated such that the first inlet port 250 at first junction 230 is opened concurrently with the first outlet port 260 at junction 240. The gas routing can then be switched such that the gas flows from the second inlet port 270 at junction 240 to the second outlet port 280 at junction 230.

Figure 4:
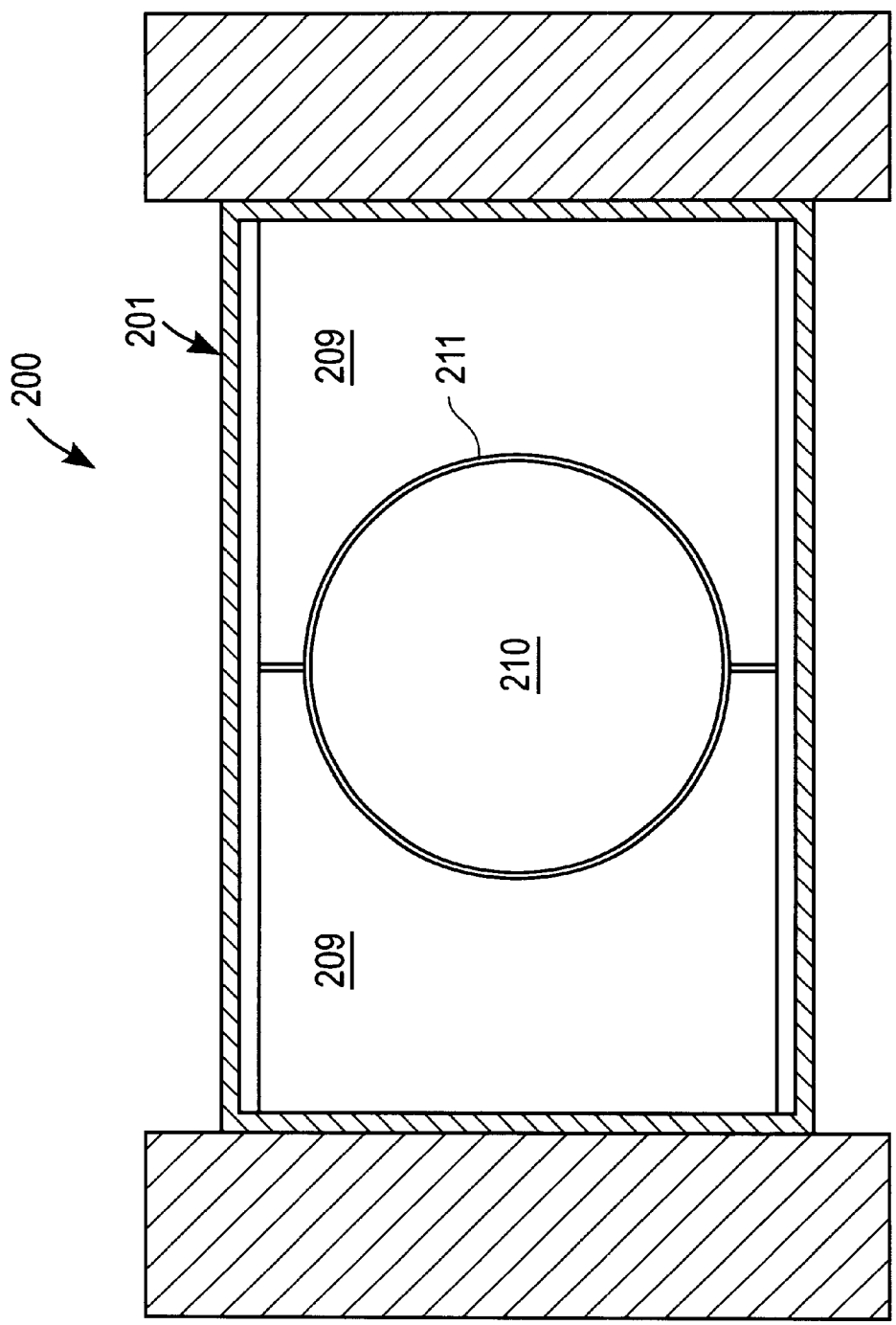
FIG. 4 is a cross-sectional top view of the bi-directional chamber of FIG. 3, taken along line 4—4 of FIG. 3.

As shown in FIG. 3, the interior of the chamber 200 is divided into an upper portion 203 and a lower portion 205 by a tray 209. Tray 209 surrounds circular platform 210 (see FIG. 4). Referring to FIG. 4, tray 209 can have a rectangular outer edge which extends to the sides of the rectangular enclosure 201. Tray 209 can be divided into two halves or can be a single piece. Tray 209 in conjunction with platform 210, can serve to confine the process gases to one of the upper portion 203 or lower portion 205 of the chamber 200.

FIG. 3 also shows inlet purge ports 290 and outlet purge ports 292 for the lower portion 205 of the chamber 200. Purge ports 290 and 292 are also located in junctions 230 and 240. These inlet and outlet purge ports are for purging the lower section. They could be operated such that the inlet port at junction 230 is open while the exhaust port at junction 240 is open in unison with the top flow. However, they do not necessarily have to be switched between one end and the other. A flow imbalance could be used with two inlets and one exhaust or one inlet and two exhausts to provide purging of the lower portion 205, or a single gas inlet/gas outlet purge port could be used with the inlet in one junction and the outlet in the other junction.

As shown in FIG. 4, a circular opening 211 in tray 209 is provided to accommodate platform 210. As described below, platform 210 holds the substrate (not shown) during processing. Also, platform 210 can be moved vertically through the opening 211 in certain embodiments described below, or can be supported by the tray 209 for the chamber configuration shown in FIG. 3.

Referring again to FIG. 3, platform 210 can be a susceptor that holds a substrate 220. Alternatively, platform 210 can be an edge ring. A susceptor is typically a solid circular body on which the substrate rests. A susceptor provides good thermal uniformity to the substrate. An edge ring is typically an annular ring on which the substrate rests. The substrate contacts the edge ring only around its edge. The edge ring has a central opening that exposes the bottom side of the substrate to the heat energy provided by a lower array of lamps.

Alternatively, in lieu of a platform, tray 209 can support the wafer or substrate 220 and confine the deposition or etch gases to the region on one side of the wafer (i.e., the upper portion 203 of chamber 200). The tray 209 can extend under the wafer providing a susceptor for the radiant or induction heating, or the tray can form an annular ring that supports the wafer at its edge. When the tray 211 is an annular ring, the bottom side of the substrate 220 is exposed to the heat source (not shown) and can be heated and cooled much more rapidly.

Referring again to FIG. 3, a substrate passage 218 is provided in one of the junctions such that a wafer, or any substrate suitable for a deposition or etching process, can be inserted into the chamber 200. FIG. 3 shows passage 218 in first junction 230 for illustrative purposes. The passage 218 can be provided on either junction.

A substrate lift mechanism 214 for lifting the wafer is provided in the lower portion 205 of the chamber 200 in each junction. Substrate lift mechanism 214 includes upwardly extending pins 215 that contact the substrate 220 at its edge, or inwardly from its edge at its bottom surface, to lift the substrate during loading and unloading of the substrate 220 into the chamber 200.

The substrate lift mechanism 214 can also include arms 219 and pistons 222. Pistons 222 can be located in each junction that is provided at the edge of the chamber 200. Alternatively, the pistons 222, or other moving mechanism, can be located externally from the chamber 200 in locations other than the junctions. Arms 219 extend into the lower portion 205 of the chamber 200. Providing a lifting mechanism in each junction eliminates the need for extending the arms of the lifting mechanism under the area occupied by the wafer, and thus avoids any problems with blocking the path of the radiant heat from below the chamber, which could reduce the temperature uniformity across the substrate.

Figure 5:
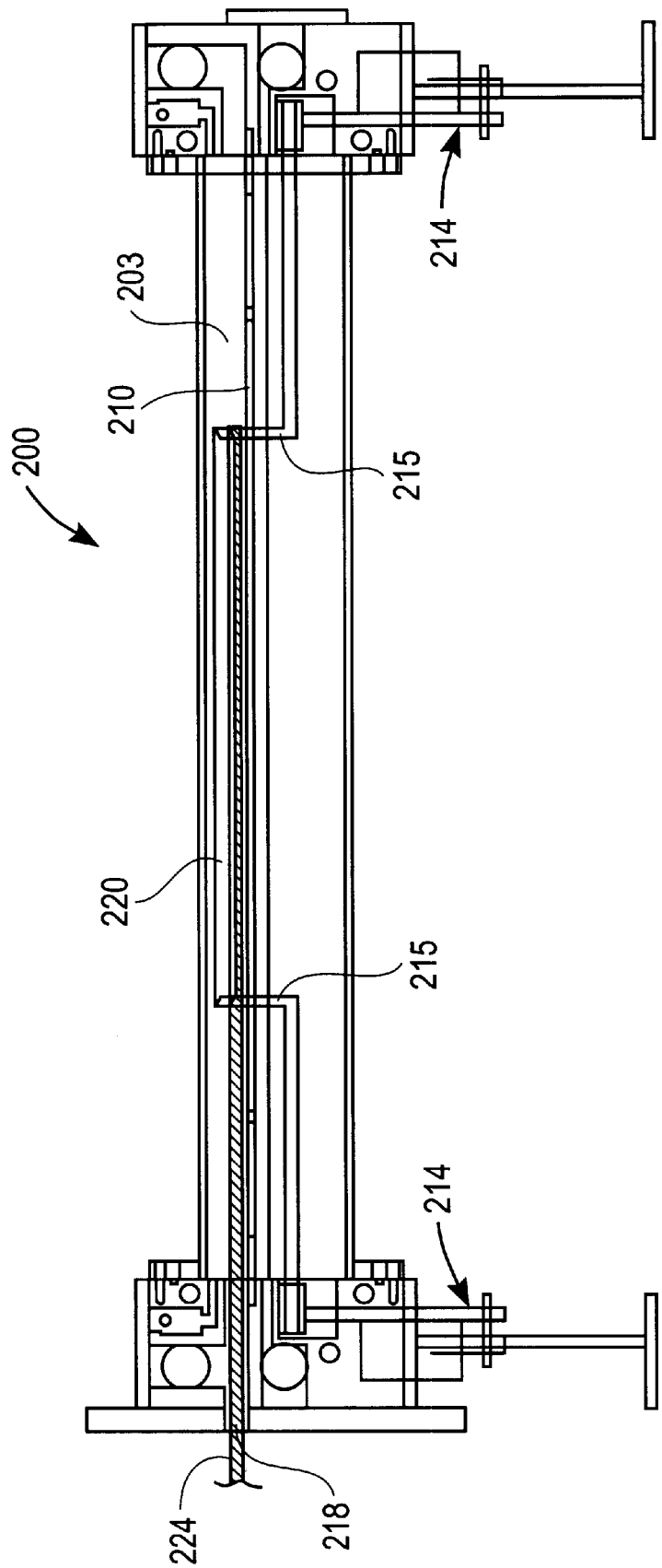
FIG. 5 is a side cross-sectional view of the bi-directional chamber of FIG. 3 showing a substrate being loaded.

FIG. 5 shows a substrate 220 elevated by the lifting mechanisms 214 such that a robot blade 224 from a wafer transfer mechanism (not shown) can be inserted under the substrate 220 for loading or unloading the wafer from the process chamber 200. During loading, the blade 224 carrying a substrate 220 is inserted through the substrate passage 218 and into the upper portion 203 of the chamber 200. When the blade positions the substrate above the pins 215 of the lifting mechanism 214, the lifting mechanism 214 is moved upwardly such that the pins 215 contact the substrate 220 and lift the substrate 220 off the blade 224. Blade 224 is then removed from the chamber, and lifting mechanism 214 is lowered such that the substrate 220 is placed onto platform 210. Unloading the substrate 220 is accomplished simply by reversing the loading process.

FIG. 5 shows pins 215 lifting substrate 220 at its edge. Alternatively, pins 215 can contact the substrate at its bottom surface inwardly from the edge of the substrate.

The chamber 200 can be heated by a variety of heating techniques for high temperature thermal processing including radiation (typically infrared) heating, induction heating or resistive heating. FIGS. 6–11 show three variations of radiant heaters.

Figure 6:
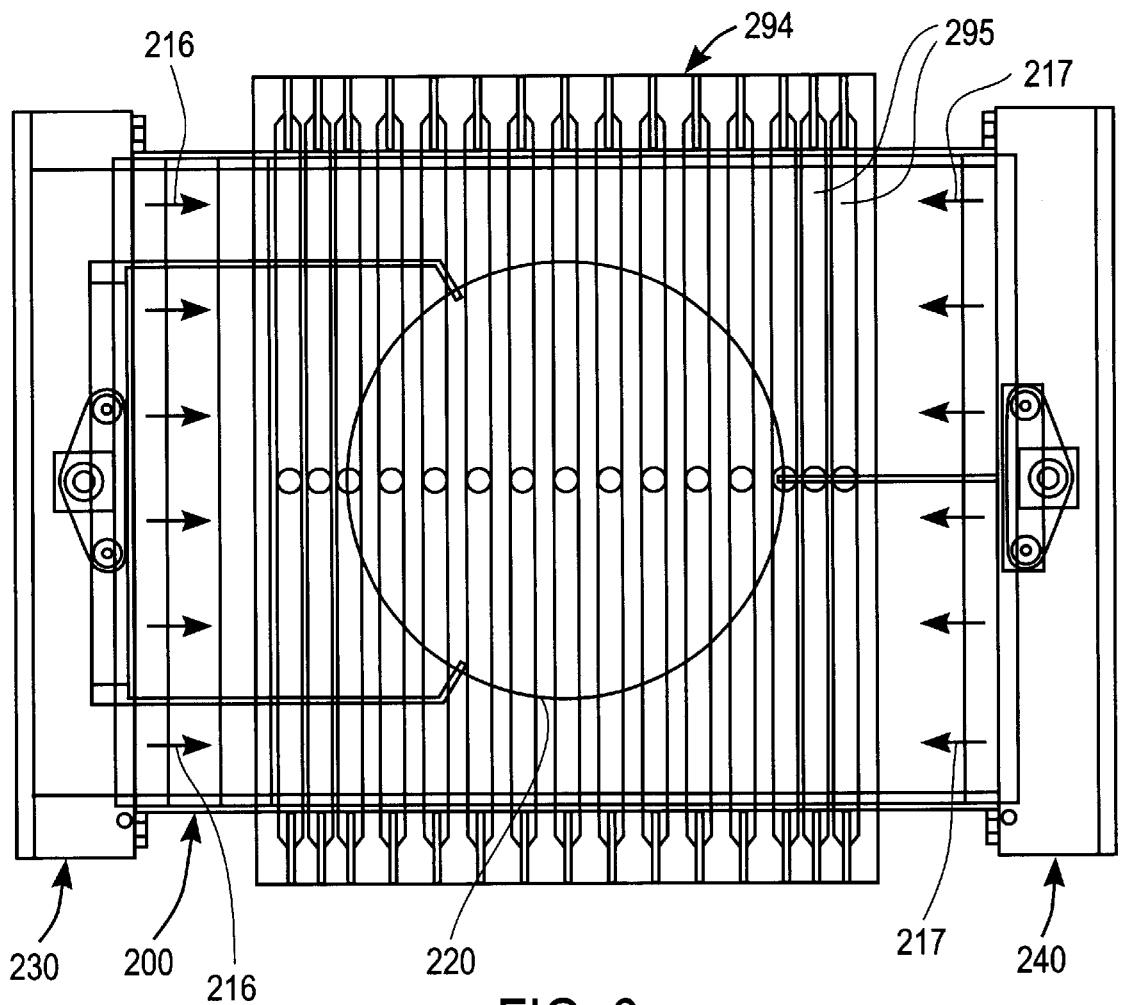
FIG. 6 is a top plan view of an embodiment of a lamp array and a semiconductor processing chamber.
Figure 7:
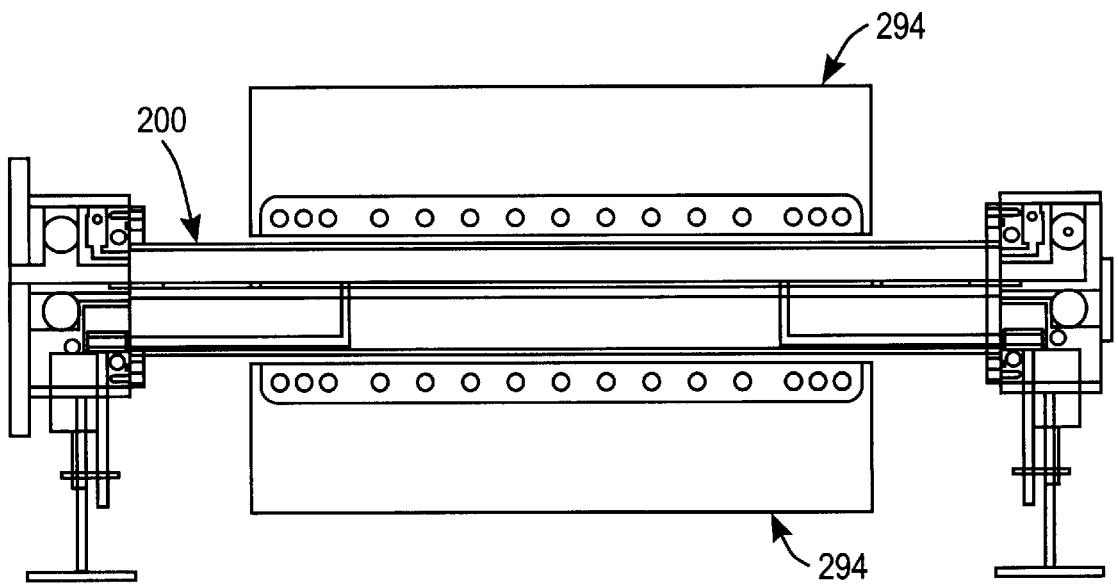
FIG. 7 is a side elevational view of the lamp array and processing chamber of FIG. 6.

FIGS. 6 and 7 show a rectangular lamp array 294 that includes a plurality of linear lamps 295. Chamber 200 is generally rectangular with first junction 230 and second junction 240 located at opposing ends of the chamber 200. Arrows 216 and 217 represent first and second gas flow directions, respectively. As illustrated in FIG. 6, the gas is injected into the chamber from each junction 230 and 240 such that a rectangular flow field is produced. A rectangular flow field is wider than the diameter of substrate 220 so that edge effects are minimized. The rectangular lamp array 294 produces a rectangular heating zone that heats the gas evenly from one side of the chamber to the other as the gas flows across the substrate 220. The rectangular flow field and rectangular heating zone together minimize the edge effects of the depletion of the gas. This is because the depletion of the chemical species within the gas begins when the gas is heated. Since the gas is heated evenly across the entire width of the flow field, the depletion from side to side is minimized with a rectangular lamp array. However, because the semiconductor substrates are typically round, a rectangular lamp array or heating source does not optimize the thermal effect of the heat energy on the round substrate.

Figure 8:
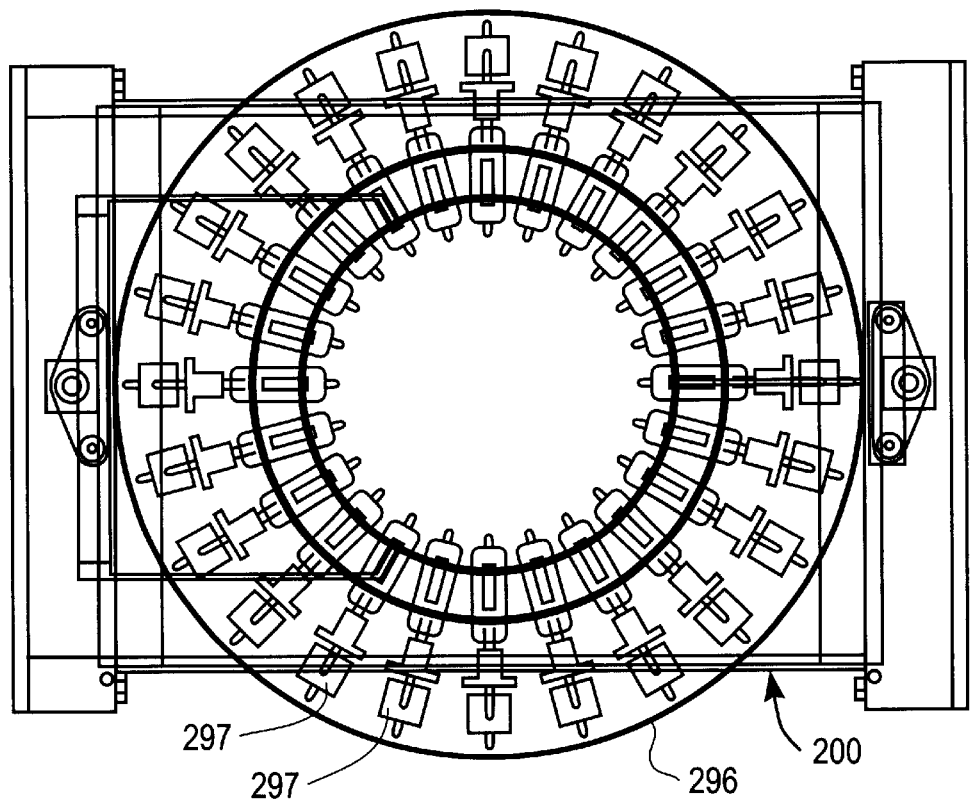
FIG. 8 is a top plan view of another embodiment of a lamp array and a semiconductor processing chamber.
Figure 9:
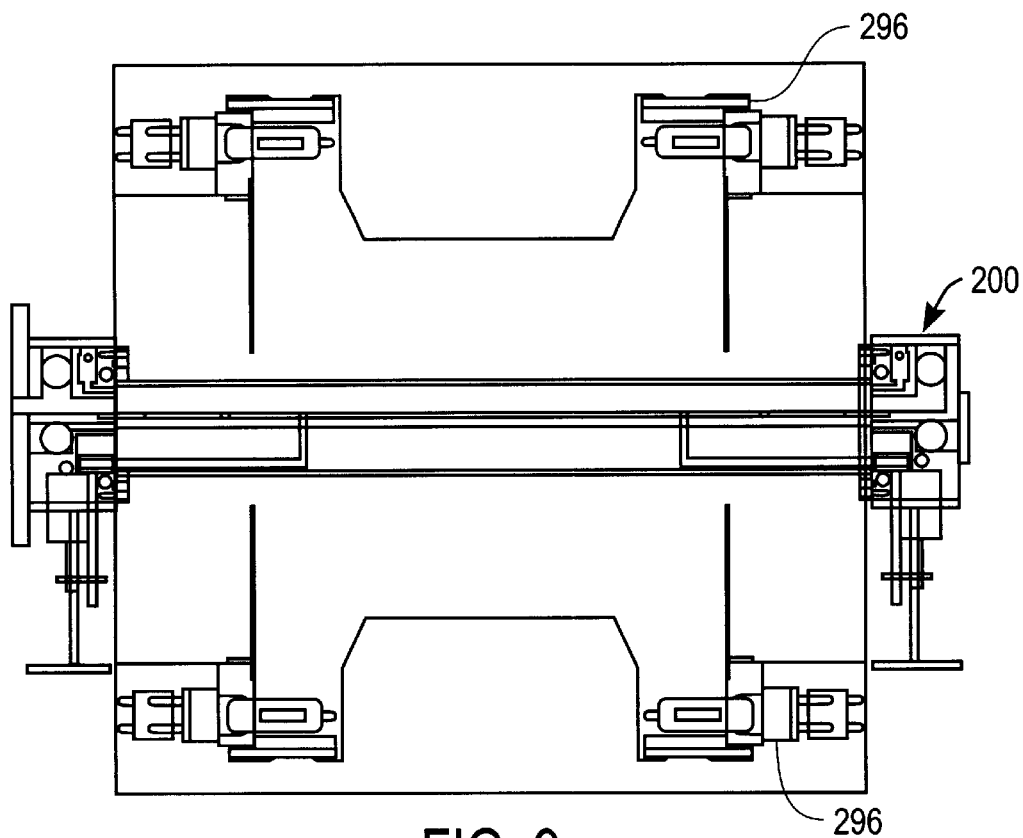
FIG. 9 is a side elevational view of the lamp array and processing chamber of FIG. 8.

FIGS. 8 and 9 show chamber 200 with a circular lamp array 296. Circular lamp array 296 includes a plurality of lamps 297 arranged in an annular circle, as shown in FIG. 8. A circular lamp array typically exhibits better thermal effects on the circular substrate. However, it may be necessary to adjust the gas flow field over its width in order to optimize uniformity of the depletion of the chemical species from the process gas onto the wafer.

Figure 10:
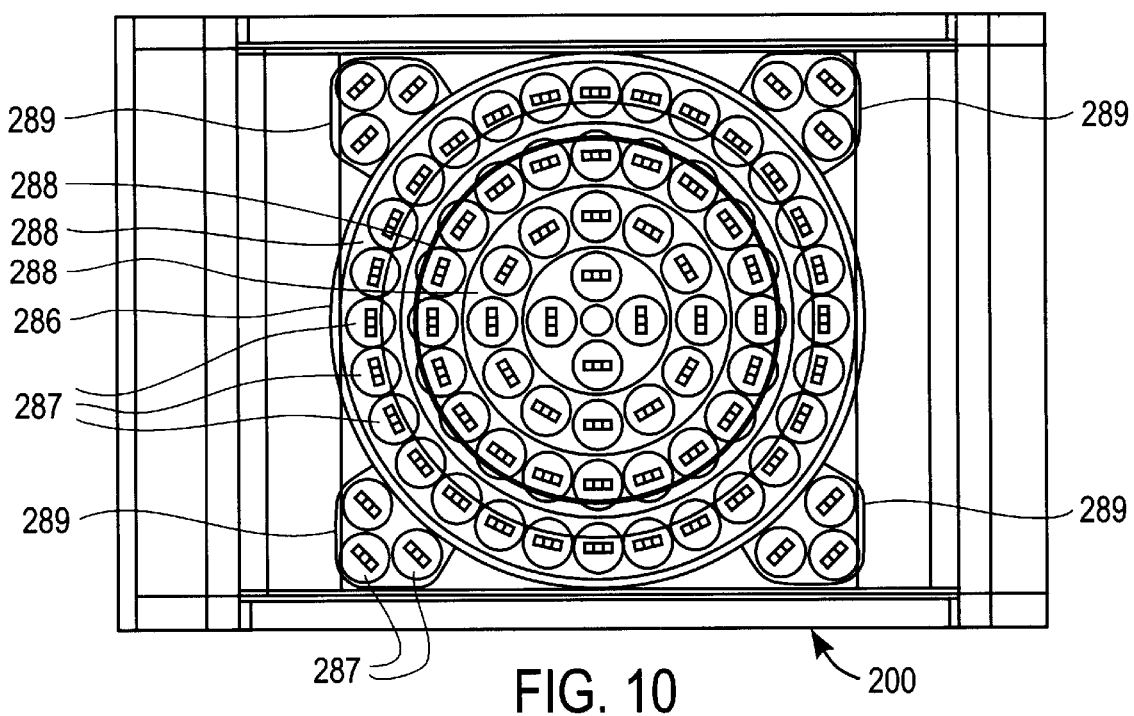
FIG. 10 is a top plan view of another embodiment of a lamp array and a semiconductor processing chamber.
Figure 11:
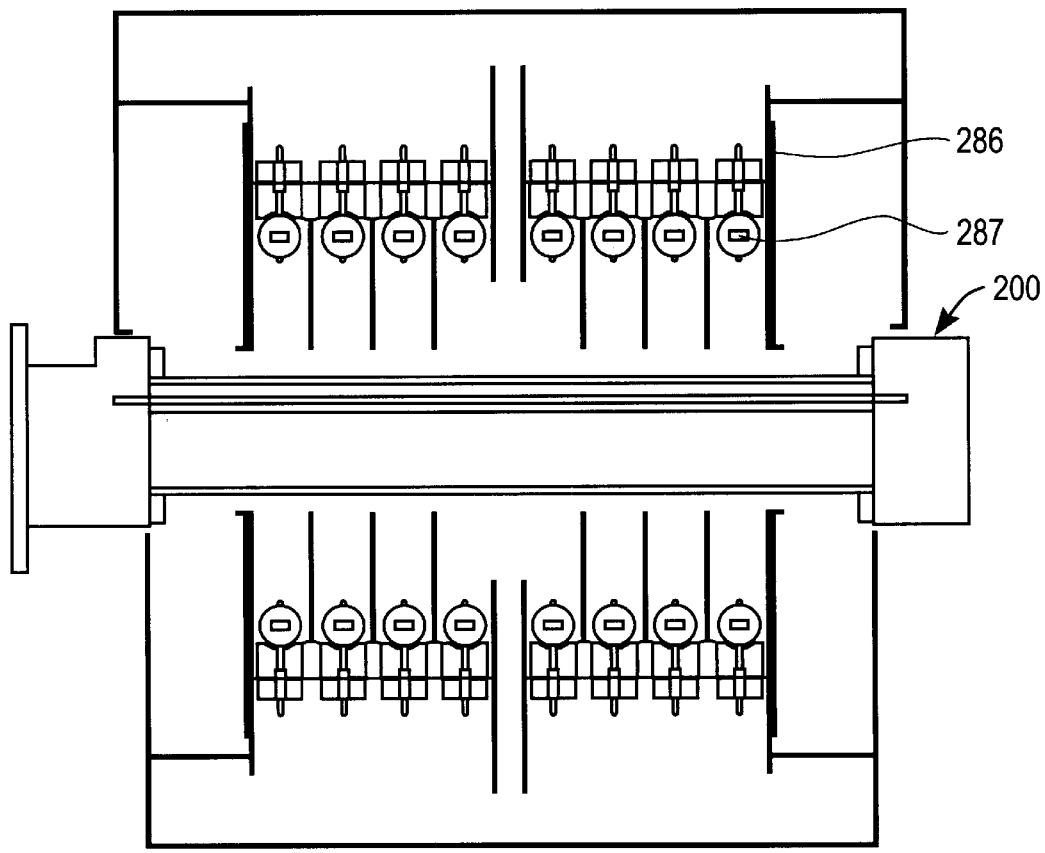
FIG. 11 is a side elevational view of the lamp array and processing chamber of FIG. 10.

FIGS. 10 and 11 show chamber 200 with a concentric lamp array 286. Concentric lamp array 286 includes a plurality of lamps 287 arranged in a plurality of concentric rings 288, as shown in FIG. 10. Additionally, corner arrays 289 may be added to the concentric array 286 to provide a more rectangular heating pattern, while retaining the desirable characteristics of the heating pattern of a circular lamp array. Corner arrays can also be used with the circular lamp array shown in FIG. 8, or any other circular-type lamp array.

It should be noted that the lamp arrays shown in FIGS. 6–11 are examples of heating systems that can be used with any of the bi-directional process chambers described herein.

Figure 12:
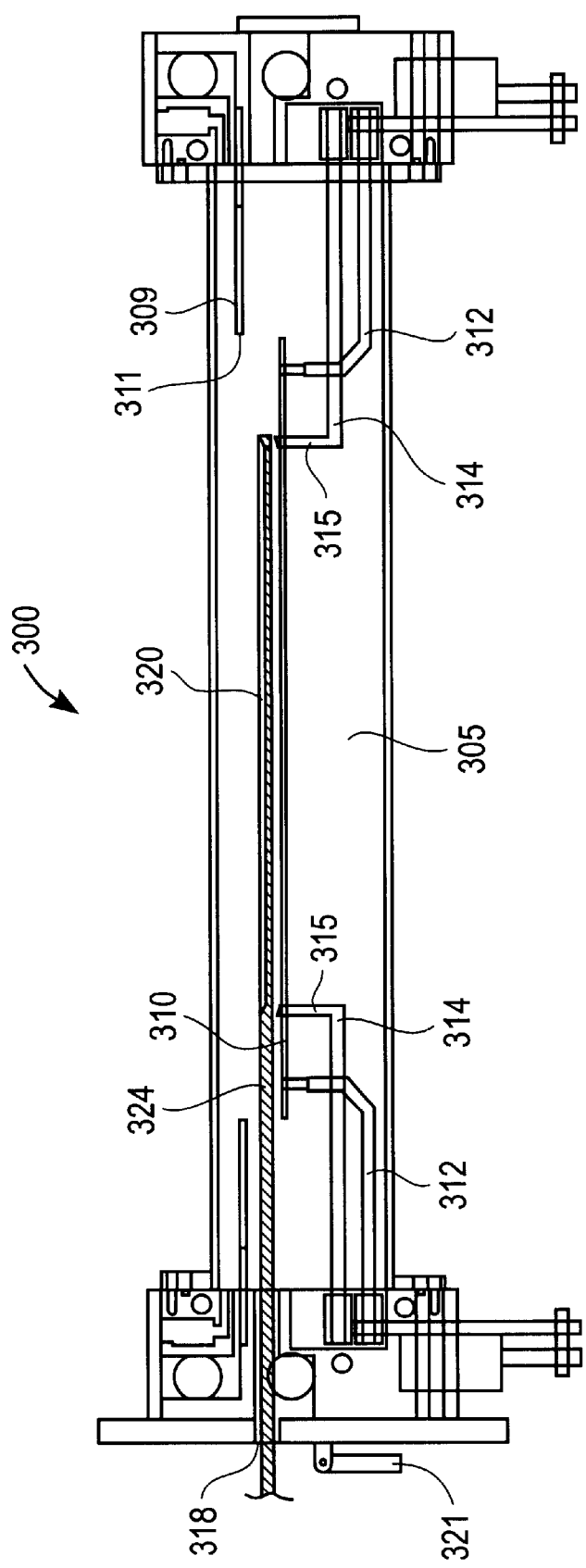
FIG. 12 is a side cross-sectional view of an alternate embodiment of a semiconductor processing chamber showing a substrate being loaded.
Figure 13:
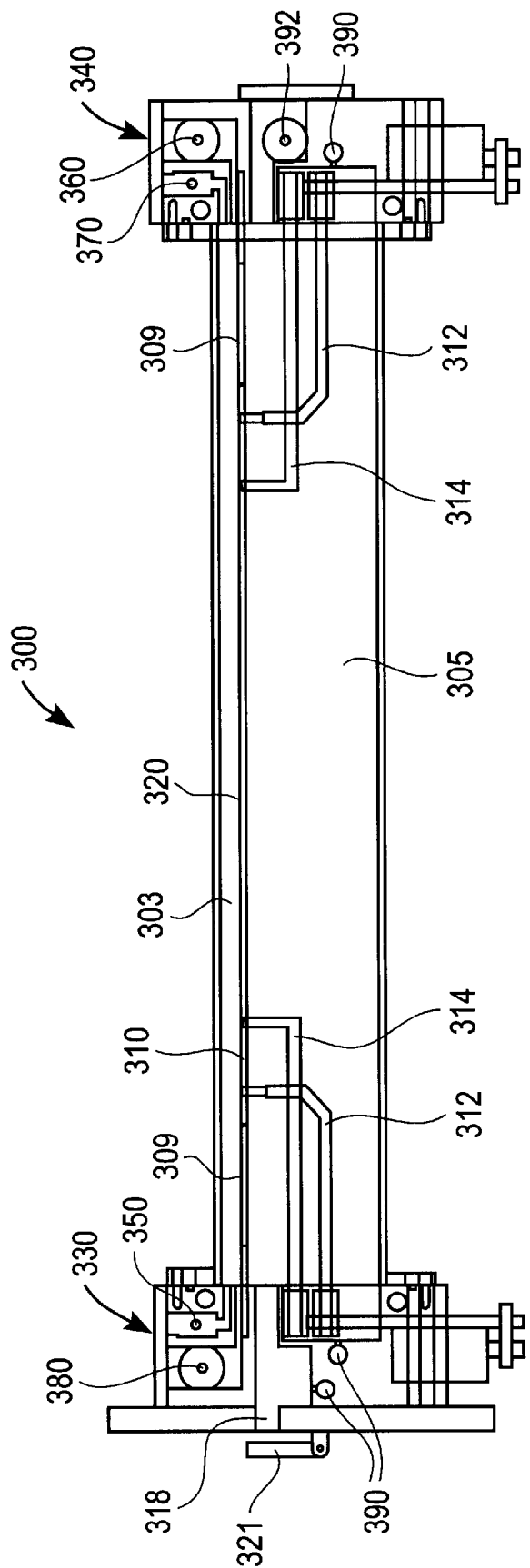
FIG. 13 is a side cross-sectional view of the processing chamber of FIG. 12.
Figure 14:
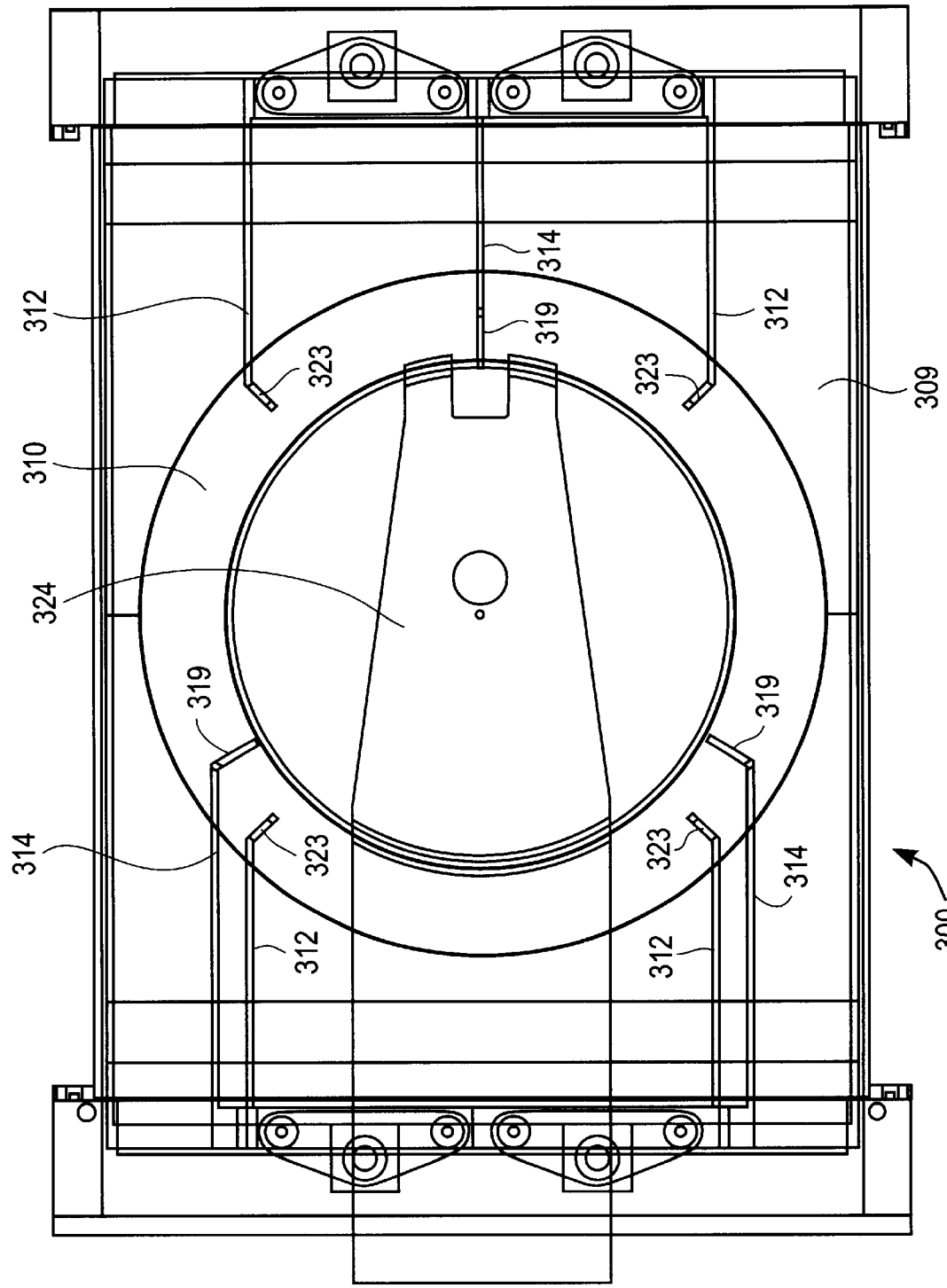
FIG. 14 is a top plan view of the semiconductor processing chamber of FIG. 12.

FIGS. 12–14 show another embodiment of a semiconductor processing chamber 300. As shown in FIG. 12, the wafer handling (loading or unloading) is done in the lower portion 305 of the chamber. Substrate passage 318 communicates with lower portion 305 of chamber 300. Substrate passage door 321 provides access to the lower portion 305 of the chamber. A wafer transfer mechanism (not shown) includes a blade 324 that carries substrate 320 into and out of the chamber 300 through passage 318 when door 321 is open. Because the wafer handling is done in the lower portion 305 of the chamber 300, passage 318 is located where there are no process gases.

FIG. 12 shows the relative position of the platform 310, platform lift mechanism 312, and substrate lift mechanism 314 during one point in the wafer handling process. Platform 310 can be either an annular ring (such as an edge ring) or a circular plate (such as a susceptor). Tray 309 can be a rectangular shaped tray having a circular opening 311 that accommodates platform 310 as described below.

Blade 324 is shown extending through the substrate passage 318 while carrying substrate 320 on its top side. Lift mechanisms 312 and 314 are shown in their lowered positions. After blade 324 positions substrate 320 above the lift mechanisms, pins 315 of the substrate lift mechanism 314 are raised to lift the substrate 320 off the blade 324. Blade 324 is then withdrawn from the chamber. At this point, the substrate lift mechanism 314, with the substrate 320 resting on the tops of pins 315, is lowered, or platform lift mechanism 312 is raised, such that the substrate 320 is placed onto platform 310. Platform lift mechanism 312 then raises platform 310 to the level of tray 309. Processing is then commenced.

FIG. 13 shows the position of the platform 310, substrate 320, and lift mechanisms 312 and 314 during a deposition or etching process. The platform 310 is shown aligned with tray 309. Tray 309 and platform 310 divide the interior of the chamber 300 into an upper portion 303 and lower portion 305. Door 321 is shown in its closed position.

FIG. 13 also shows first inlet port 350 at first junction 330, and first outlet port 360 at second junction 340. Second inlet port 370 is located on second junction 340, and second outlet port 380 is located on first junction 330. The bi-directional flow of the process gas is provided in chamber 300 in a manner similar to that of previously described embodiments.

FIG. 13 shows two purge inlet ports 390 on first junction 330 and one on second junction 340. Purge outlet ports 392 is shown on second junction 340. Purge inlet ports 390 and purge outlet ports 392 that communicate with lower portion 305 of chamber 300. The purge inlet and outlet ports purge the lower portion of the chamber such that process gases are not present in the lower portion 305. Thus, process gases will not deposit the chemical species in the vicinity of the door 321 to substrate passage 318. This configuration minimizes particle contamination problems that can occur when the chemical species are deposited on surfaces in the chamber, and in particular, on door 321.

FIG. 14 is a top view of chamber 300 showing the circular platform 310, the platform and substrate lift mechanisms 312 and 314, as well as a top view of the blade 324. The platform lift mechanism 312 is shown having four support arms 323 while the substrate lift mechanism 314 is shown having three support arms 319.

The platform 310 can be a susceptor that is silicon carbide (SiC) coated graphite. For a circular lamp array, such as shown in FIG. 8, the tray 309 surrounding the susceptor is not heated and could be quartz or graphite. For a linear lamp array, such as shown in FIG. 6, or for the rectangular heating pattern shown in FIG. 10, the tray 309 surrounding the susceptor is heated and would, therefore, preferably SiC coated graphite. A SiC coated graphite tray will more evenly absorb the heat produced in a rectangular pattern by the linear lamp array. Thus, the process gas flow can be more evenly heated across the width of the process chamber, resulting in more uniform deposition or etching.

Figure 15:
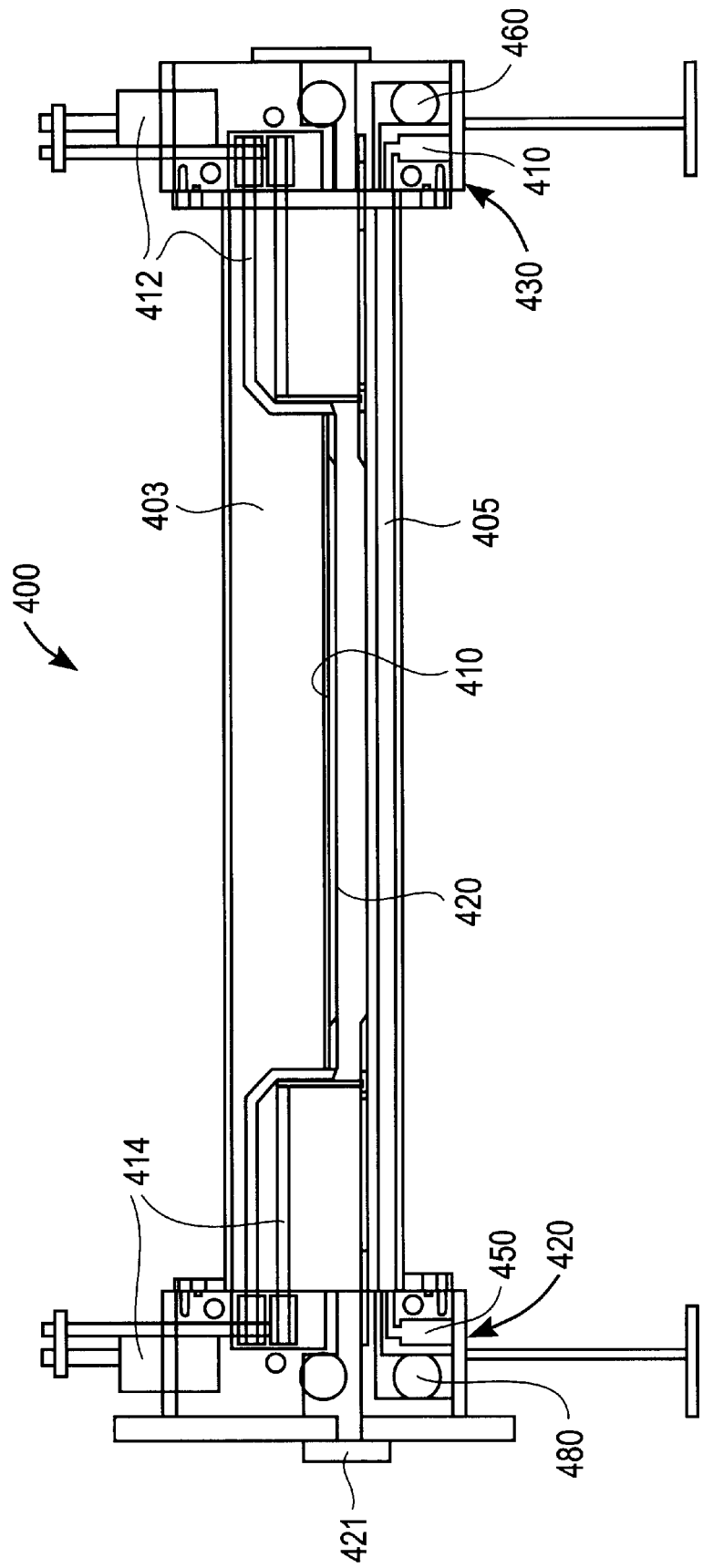
FIG. 15 is a side cross-sectional of yet another alternate embodiment of a semiconductor processing chamber.

FIG. 15 shows another embodiment of a semiconductor substrate processing chamber 400. In this embodiment, the prime surface of the substrate 420 is facing down. The process gases flow through the lower portion 405 of the chamber. Face-down processing can decrease defects due to contaminants on the substrate because particles cannot fall onto the surface of the substrate. Chamber 400 is provided with a first inlet port 450 and a first outlet port 460 that cooperate to provide a gas flow in a first direction. Also, chamber 400 includes a second inlet port 470 and a second outlet port 480 that cooperate to produce a gas flow in a second direction. First inlet port 450 and second outlet port 480 are on first junction 420, and first outlet port 460 and second inlet port 470 are on second junction 430. The bi-directional process gas flow is provided in a manner that is similar to previously described embodiments.

A platform lifting mechanism 412 and a substrate lifting mechanism 414 are in the upper portion 403 of the chamber 400. The wafer exchange (loading or unloading) is also done in the upper portion 403 of the chamber. Wafer handling in the upper portion 403 avoids having process gases in contact with the door 421, which is opened for access by the blade (not shown) of the wafer transfer mechanism. This reduces contaminating particles in the area of the door 421. Separate mechanisms could be used for lifting the wafer and for lifting a susceptor 410 (if a susceptor is required for improving the temperature uniformity of wafer heating).

The bi-directional process chambers described herein each have openings in each end for both injection and exhaust of process gases. These openings could allow contamination or particles that gather on the surfaces of the gas outlet port to diffuse backward into the incoming gas stream from the adjacent inlet port and thus be a source of contamination during the deposition or etching process in the chamber. Separation of the inlet and outlet ports in a bi-directional process chamber can prevent potential contamination by particles or other exhaust products. One method that can be employed to decrease such contamination is shown in FIGS. 16 and 17.

Figure 16:
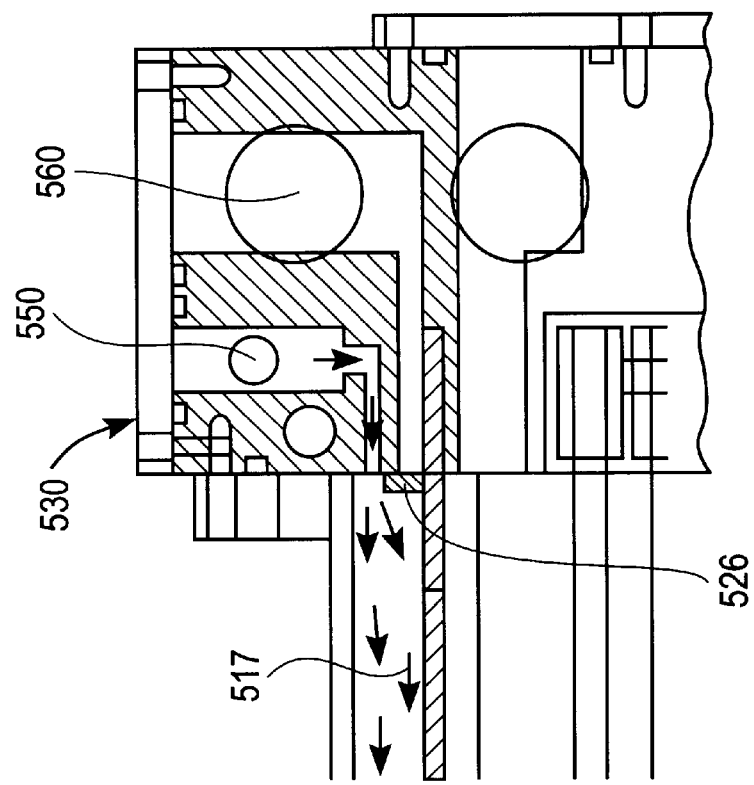
FIG. 16 is an enlarged partial cross-sectional view of a junction of a processing chamber.
Figure 17:
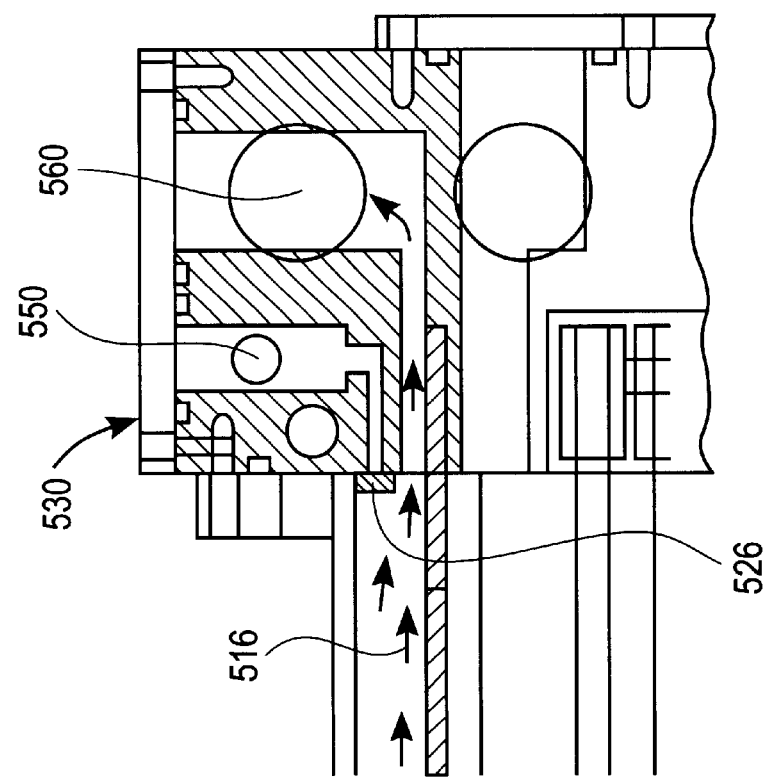
FIG. 17 is an enlarged partial cross-sectional view of a junction of a semiconductor processing chamber.

FIGS. 16 and 17 show a flap 526 that can be moved to alternately cover either the gas inlet port 550 or the gas outlet port 560 at a junction 530 of the process chamber. For illustrative purposes, only one junction is shown in FIGS. 16 and 17. Flap 526 could either be hinged, rotated, or moved laterally to cover the appropriate inlet or outlet port at each junction, depending on the direction of the gas flow. In FIG. 16, flap 526 covers the inlet port 550 when the gas flow direction is in the first direction as illustrated by arrows 516. Conversely, as shown in FIG. 17, flap 526 covers outlet port 560 when the gas flow is provided in the second direction as illustrated by arrows 517.

Figure 18:
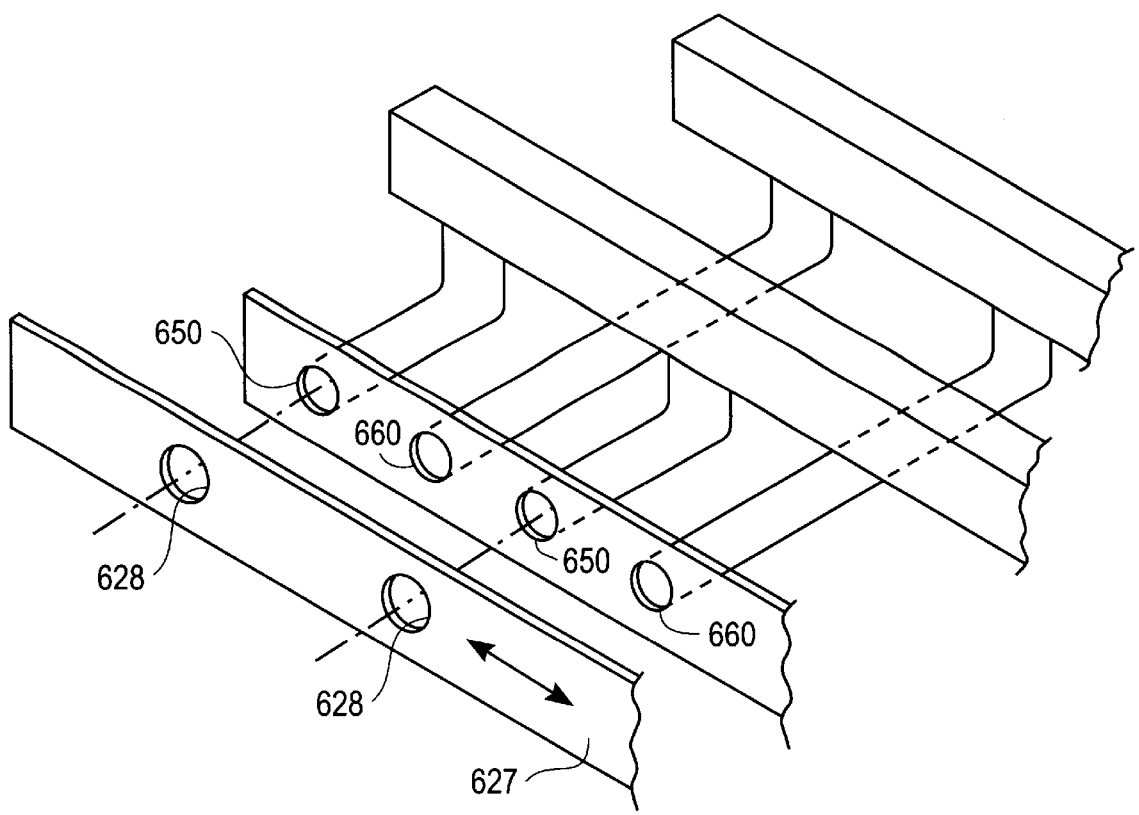
FIG. 18 is a perspective view of an embodiment of a cover for inlet and outlet ports of a bi-directional processing chamber.

An alternative apparatus that provides separation of inlet ports and outlet ports is shown in FIG. 18. Multiple gas inlet ports 650 and gas outlet ports 660 are interdigitated horizontally. A cover 627 having openings 628 spaced to be aligned with either inlet ports 650 or outlet ports 660 is moved from side to side to alternately cover either the gas inlet ports 650 or the gas outlet ports 660, while leaving the other open.

Figure 19:
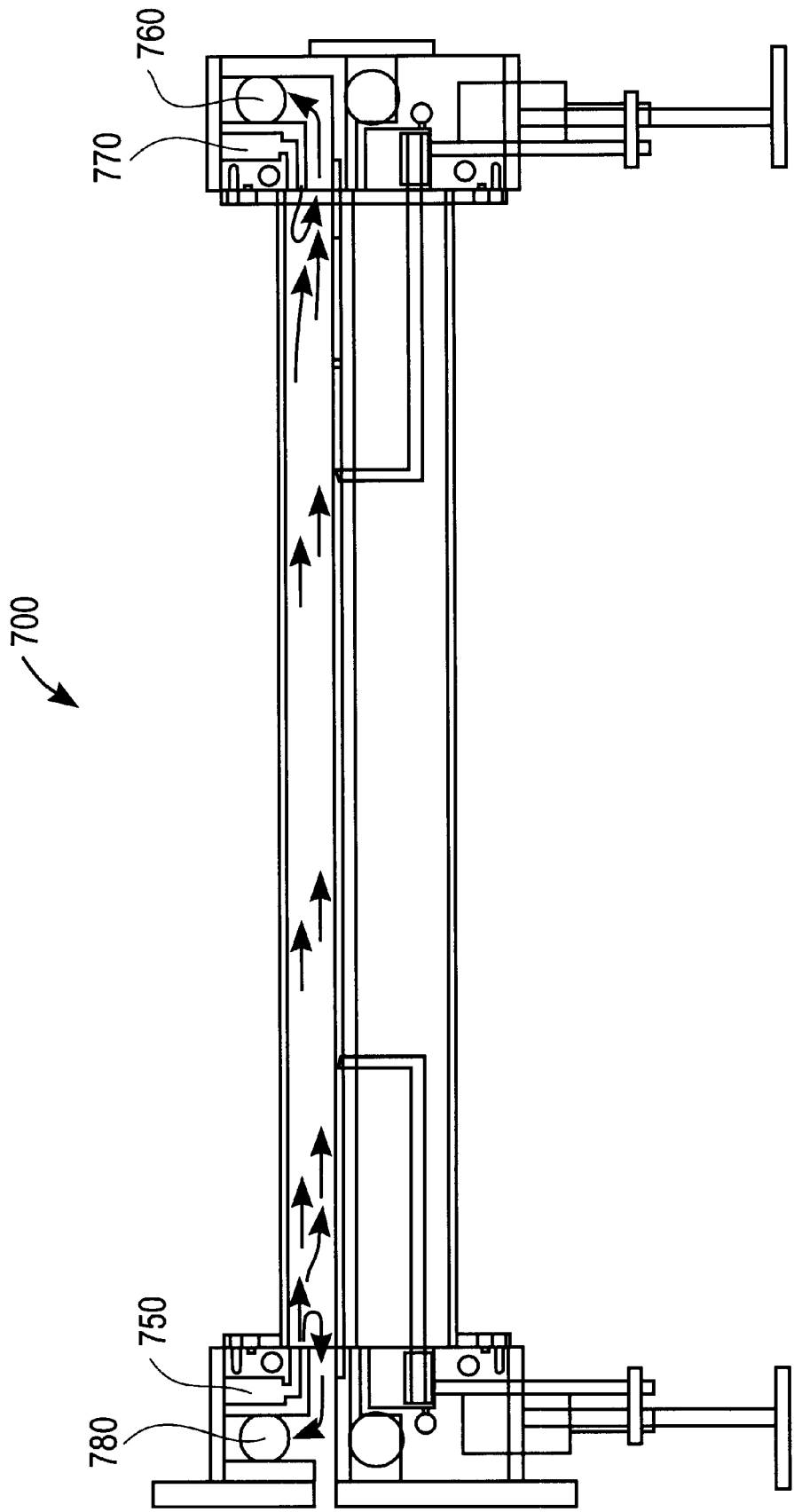
FIG. 19 a side cross-sectional view of a bi-directional processing chamber having bypass restrictors and showing flow patterns of process gas.

An alternate gas flow switching system shown in FIG. 19 does not require any mechanism in the process chamber 700. A bypass restrictor (not shown) is provided in each gas inlet and outlet port such that the inlet and outlet ports are never fully closed. Thus, all inlet ports have at least some gas flow into the chamber at all times. As such, gas species will tend not to accumulate at the inlet port that is not providing the primary gas flow. Also, since each outlet port has at least some gas flow at all times during processing, back flow is prevented which results in decreased contaminants being injected into the chamber. In this configuration, the gas inlet ports and gas outlet ports are still switched from one end of the process chamber to the other when the gas flow direction is changed, but a small gas inlet flow still exists at the end of the chamber where the gases are exhausted, and a small outlet flow continues at the opposite end of the chamber where the gases are injected. In one example, 95% of the process gas is injected at primary inlet port 750, while 5% of the gas is injected at secondary inlet port 770, which is opposite the primary inlet port 750. Approximately 90% of the gas from the primary inlet port 750 would flow through the process chamber and be exhausted at the primary outlet port 760 at the opposite end, while 5% of the gas from the primary inlet port 750 would be exhausted at the end where the gases are being injected. The 5% of the process gas from the secondary inlet port 770 is exhausted through the primary outlet port 760, which is adjacent the secondary inlet port 770.

Figure 20:
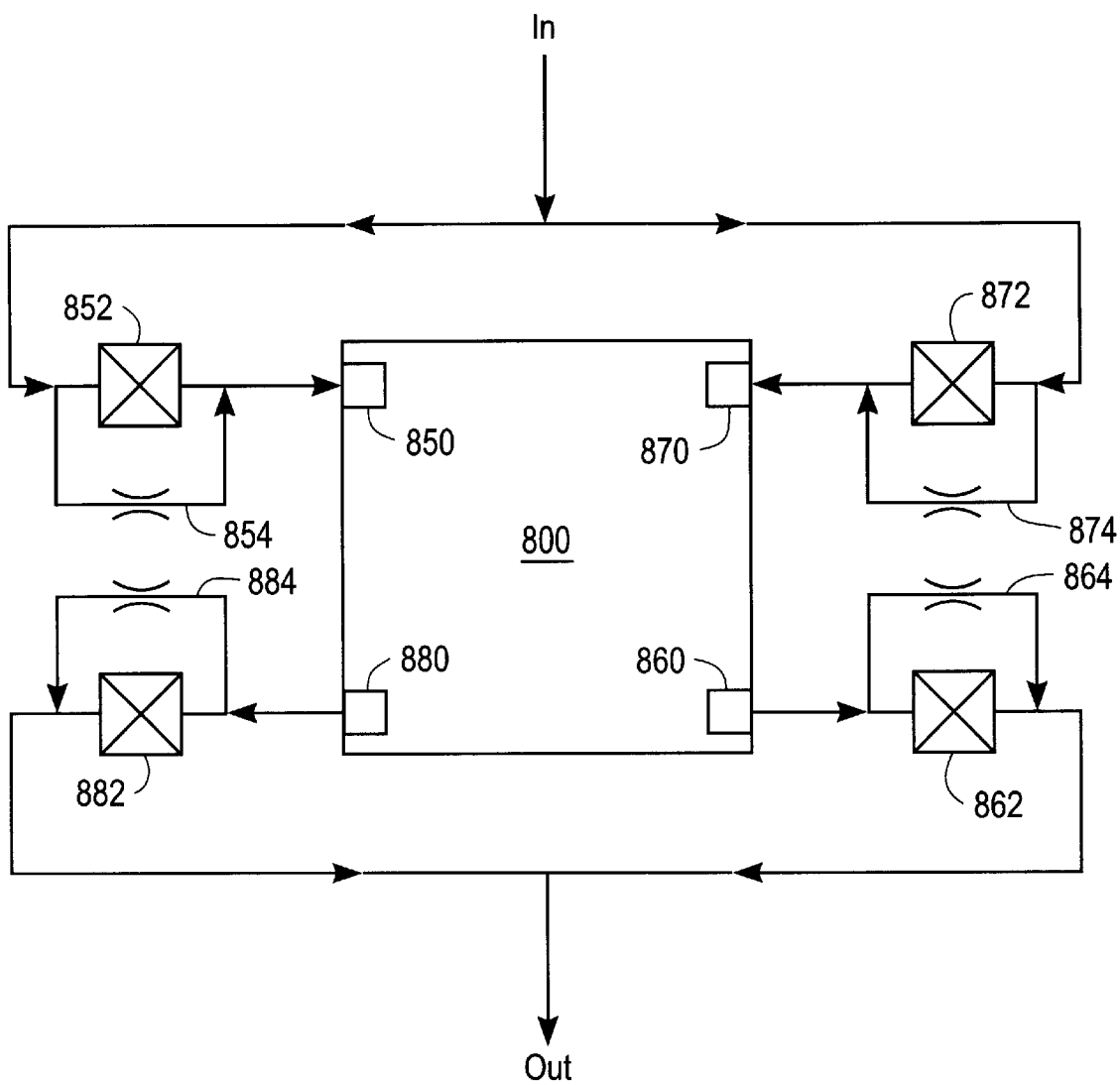
FIG. 20 is a schematic showing a bypass restrictor configuration.

FIG. 20 is a schematic diagram of a bi-directional processing chamber 800 that includes bypass restrictors associated with each inlet and outlet port. First inlet port 850 has an inlet valve 852 associated with it that controls the injection of process gas through the inlet port 850. Inlet valve 852 is open when the inlet port 850 is the primary gas inlet port. Inlet valve 872 is dosed when first inlet port 850 is the primary inlet port and second inlet port 870 is the secondary gas inlet port. When the gas flow direction is changed, the closed inlet valve is opened and the open inlet valve is closed.

Bypass restrictors 854 and 874 are associated with inlet valves 852 and 872, respectively. When the respective inlet valve is closed, the bypass restrictor associated with the closed valve allows a reduced gas flow to enter the chamber 800 through the associated inlet port. For example, when first inlet port 850 is the primary inlet port, valve 852 is open and valve 872 is closed. Bypass restrictor 874, however, allows a reduced gas flow around the closed valve 872 which then enters chamber 800 through second inlet port 870.

The outlet path of the process gas has similar valves and bypass restrictors. As shown in FIG. 20, first outlet port 860 exhausts the process gas through valve 862, when valve 862 is opened and first outlet port 860 is the primary outlet port. When the first outlet port 860 is the primary outlet port, the valve 882 associated with the second outlet port 880 is closed. However, a reduced exhaust gas flow continues through bypass restrictor 884 which provides a path around closed valve 882. When the primary outlet port is switched to the second outlet port 880, valves 862 and 882 are closed and opened, respectively.

Figure 21:
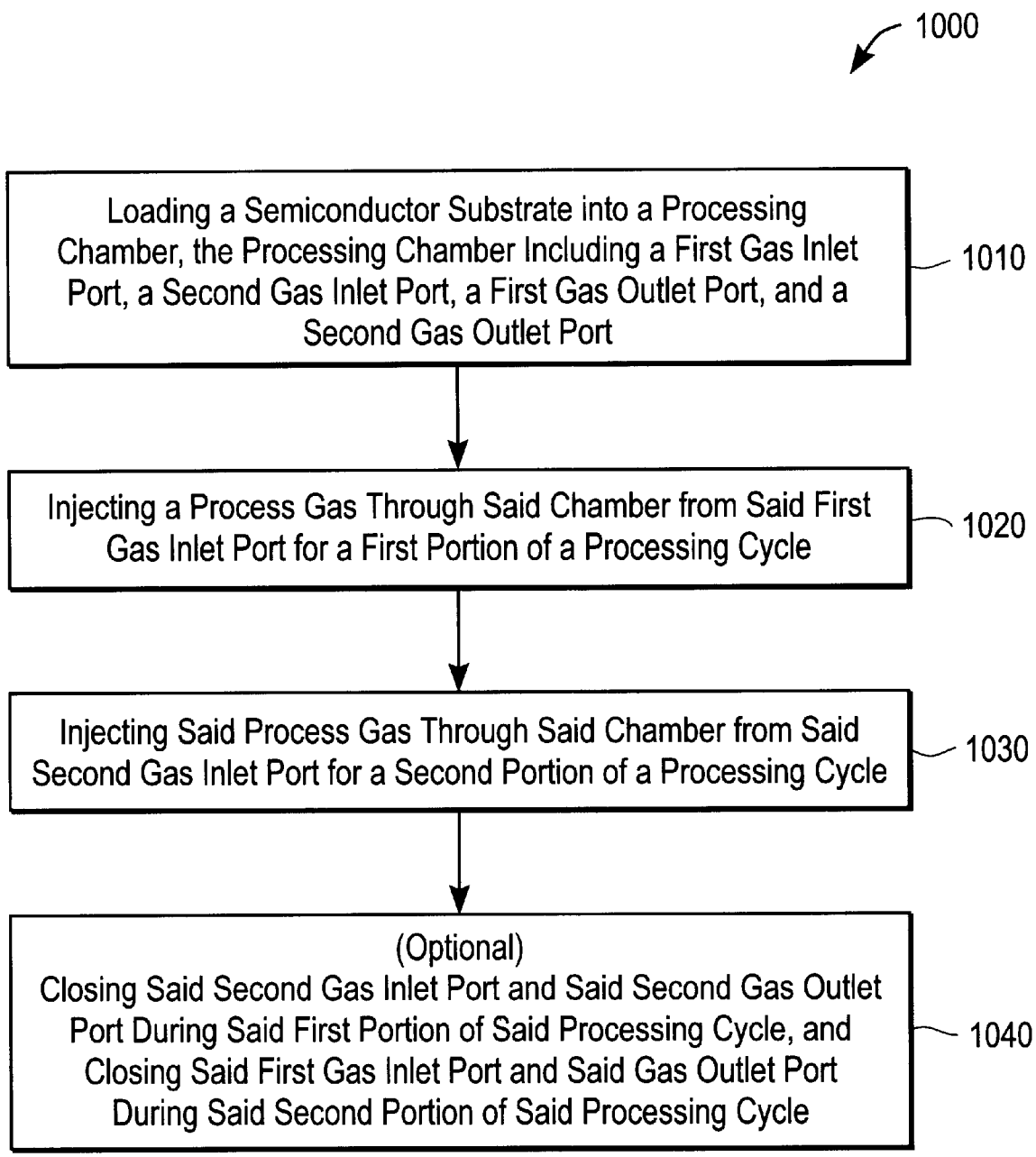

FIG. 21 is a flow chart that illustrates a method 1000 of bi-directional processing of a semiconductor substrate. The method 1000 includes the steps of loading 1010 a semiconductor substrate into a processing chamber, the processing chamber including a first gas inlet port, a second gas inlet port, a first gas outlet port, and a second gas outlet port. The loading step can include heating the substrate to the desired process temperature and/or purging the chamber in preparation for processing. The method 1000 further includes injecting 1020 a process gas through the chamber from the first gas inlet port for a first portion of the processing cycle. Method 1000 further includes injecting 1030 the process gas through the chamber from the second gas inlet port for a second portion of a processing cycle.

The method 1000 shown in FIG. 21 may further include closing 1040 the second gas inlet port and the second gas outlet port during the first portion of the processing cycle, and closing the first gas inlet port and the first gas outlet port during the second portion of the processing cycle. The method 1000 can be performed in any of the previously described bi-directional processing chambers.

Figure 22:
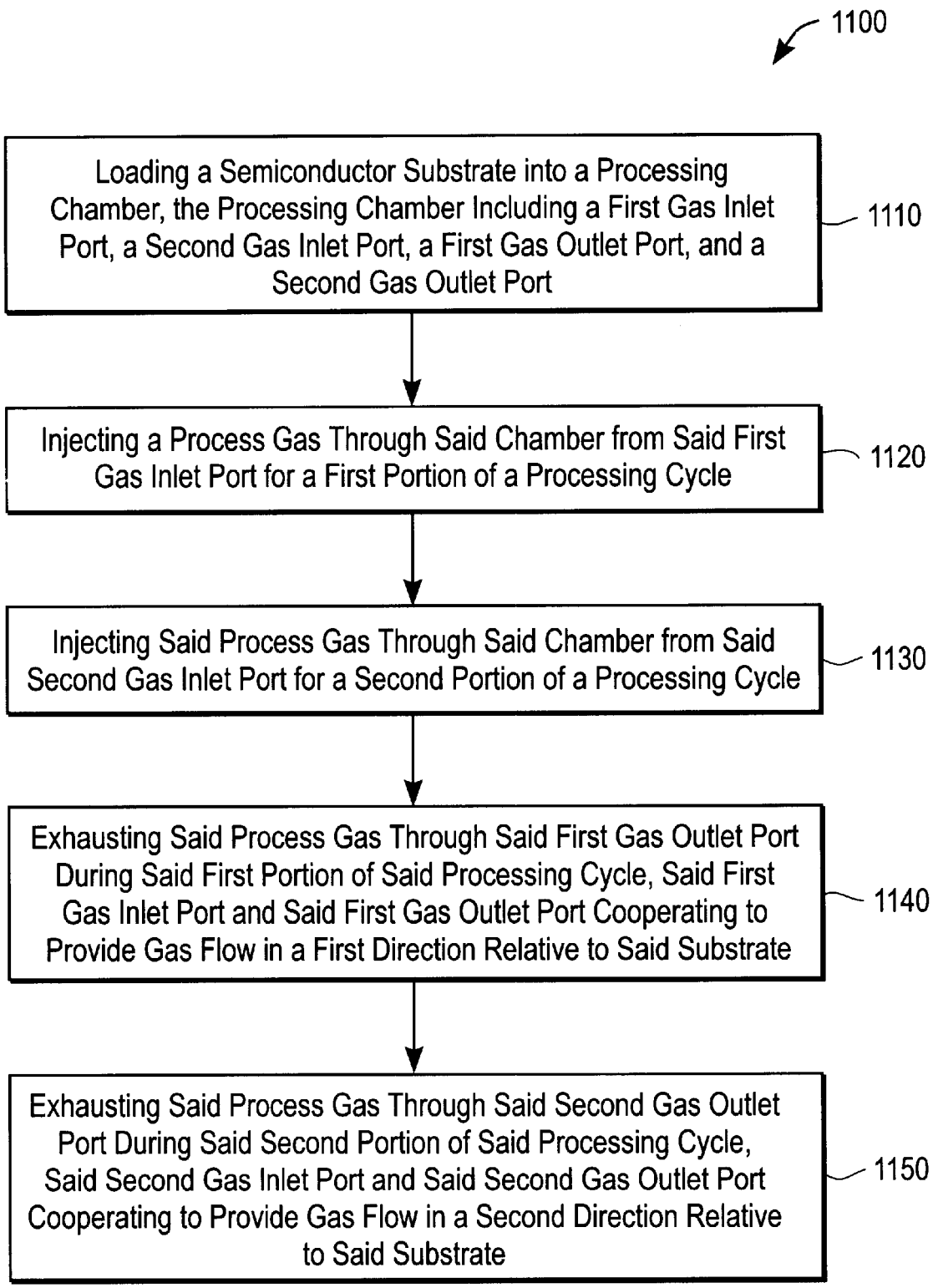

FIG. 22 is a flowchart illustrating an alternate method 1100 for bi-directional processing of a semiconductor substrate. The method 1100 includes loading 1110 a semiconductor substrate into a processing chamber, the processing chamber including a first gas inlet port, and second gas inlet port, a first gas outlet port, and second gas outlet port. Also, method 1100 includes injecting 1120 a process gas through the chamber from the first gas inlet port for a first portion of a processing cycle, and injecting 1130 the process gas through the chamber from the second gas inlet port for a second portion of a processing cycle.

Method 1100 can further include exhausting 1140 the process gas through the first gas outlet port during the first portion of the processing cycle, the first gas inlet port and the first gas outlet port cooperating to provide gas flow in a first direction relative to the substrate. Method 1100 can also include exhausting 1150 the process gas through the second gas outlet port during the second portion of the processing cycle, the second gas inlet port and the second gas outlet port cooperating to provide gas flow in a second direction relative to the substrate.

Method 1100 is preferably performed such that the first direction is generally parallel to and opposite the second gas flow direction. Also, the first portion of the processing cycle is preferably about equal in time to the second portion of the processing cycle. The first portion of the processing cycle can be about one-half of the processing cycle and the second portion of the processing cycle is the remainder of the processing cycle. As previously described with respect to the bi-directional processing chamber configurations, the processing cycle is preferably divided such that the flow direction is changed midway through the cycle to provide a uniform deposition or etching rate on the substrate. The bi-directional processing chamber can thus provide uniform layer thickness or etching rate without necessitating rotation of the substrate during processing. The substrate is preferably stationary during the entire processing cycle.

Figure 23:
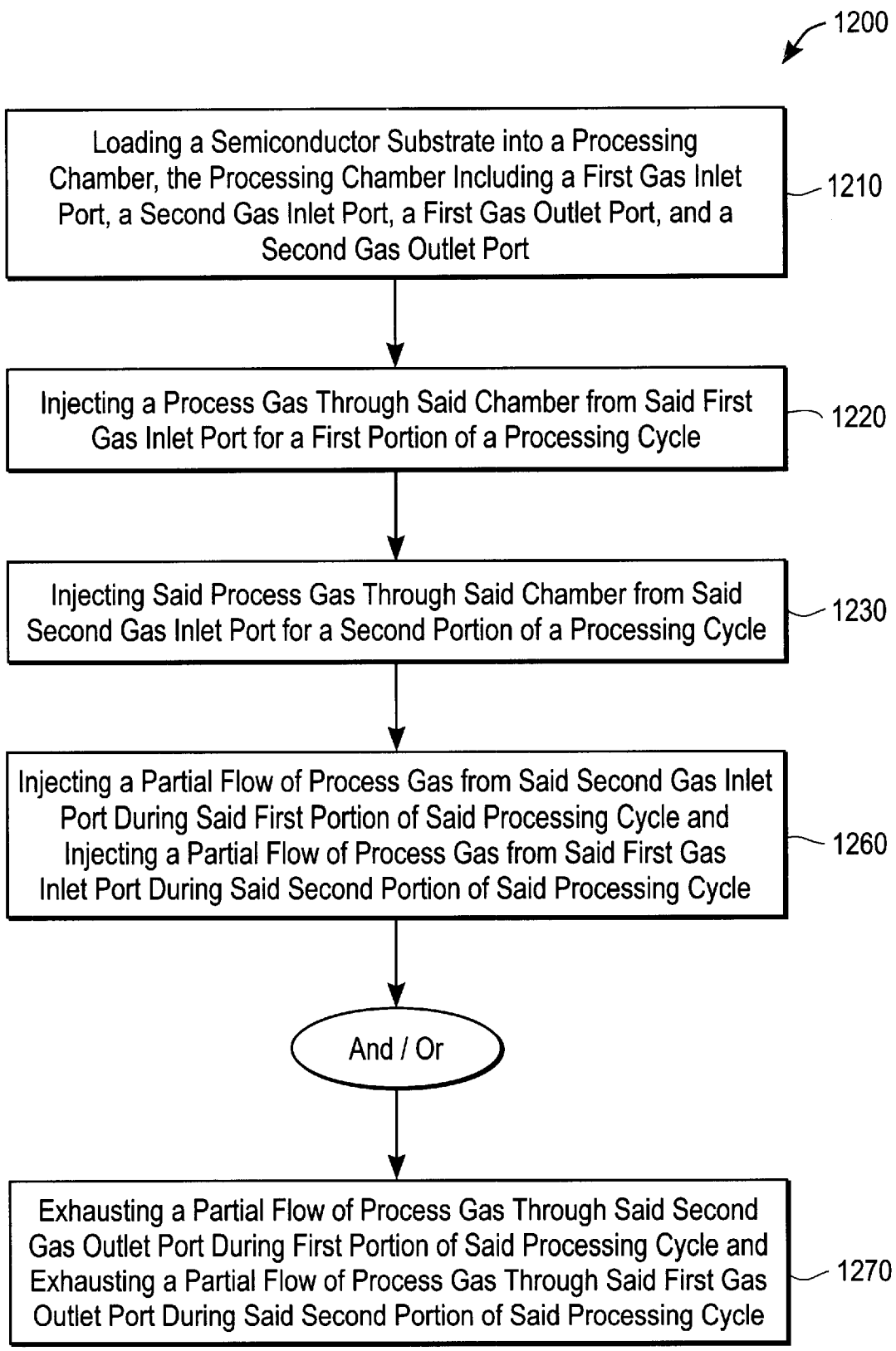

FIG. 23 is a flowchart illustrating yet another method 1200 for bi-directional processing of a semiconductor substrate. Method 1200 includes the first three steps of loading 1210 a semiconductor substrate, injecting 1220 a process gas from the first gas inlet port for a first portion of a processing cycle, and injecting 1230 the process gas from the second gas inlet port for a second portion of a processing cycle. Method 1200 further includes injecting 1260 a partial flow of process gas from the second gas inlet port during the first portion of the processing cycle and injecting a partial flow of process gas from the first gas inlet port during the second portion of the processing cycle. Preferably, method 1200 further includes exhausting 1270 a partial flow of process gas through the second gas outlet port during the first portion of the processing cycle and exhausting a partial flow of process gas through the first gas outlet port during the second portion of the processing cycle. Method 1210 can be performed with a process chamber including the valves and bypass restrictors as described previously with respect to FIGS. 19 and 20.

Thus, a bi-directional processing chamber and a method for bi-directional processing of semiconductor substrates have been described.

What is claimed is:

1. A semiconductor substrate processing chamber comprising: an enclosure having a first junction and a second junction; a first gas inlet port at said first junction; a first gas outlet port at said second junction; a second gas inlet port at said second junction; and a second gas outlet port at said first junction.

2. The chamber of claim 1 wherein said first gas inlet port and said first gas outlet port cooperate to provide gas flow in a first direction.

3. The chamber of claim 2 wherein said gas flow in said first direction is maintained for about one-half of a gas process cycle.

4. The chamber of claim 2 wherein said second gas inlet port and said second gas outlet port cooperate to provide gas flow in a second direction.

5. The chamber of claim 4 wherein said gas flow in said first direction is maintained for about one-half of a gas process cycle, and said gas flow in said second direction is maintained for the remainder of said process cycle.

6. A semiconductor substrate processing chamber comprising: a first gas inlet port cooperating with a first gas outlet port; a second gas inlet port cooperating with a second gas outlet port; and a substrate platform positioned within said chamber to receive a substrate to be processed, wherein said first and second inlet ports and said first and second outlet ports, respectively, cooperate to provide bi-directional gas flow with respect to said substrate platform.

7. The chamber of claim 6 wherein said first gas inlet port and said first gas outlet port cooperate to provide gas flow in a first direction with respect to said substrate platform, and said second gas inlet port and said second gas outlet port cooperate to provide gas flow in a second direction with respect to said substrate platform.

8. The chamber of claim 7 wherein said first direction is opposite said second direction.

9. The chamber of claim 6 wherein said first gas inlet port and said first gas outlet port cooperate to provide gas flow in a first direction.

10. The chamber of claim 9 wherein said gas flow in said first direction is maintained for about one-half of a gas process cycle.

11. The chamber of claim 9 wherein said second gas inlet port and said second gas outlet port cooperate to provide gas flow in a second direction.

12. The chamber of claim 11 wherein said gas flow in said first direction is maintained for about one-half of a gas process cycle, and said gas flow in said second direction is maintained for the remainder of said process cycle.

13. A semiconductor substrate processing chamber comprising: a first gas inlet port and a first gas outlet port; a second gas inlet port and a second gas outlet port; said first gas inlet port and said first gas outlet port cooperating to provide a gas flow in a first direction; and said second gas inlet port and said second gas outlet port cooperating to provide a gas flow in a second direction that is opposite said first direction.

14. The chamber of claim 13 wherein said gas flow in each of said first and second directions is provided for about one-half of a gas process cycle.

15. The chamber of claim 14 further comprising a substrate holder that is stationary during said gas process cycle.

16. A semiconductor substrate processing chamber comprising: a first gas inlet port cooperating with a first gas outlet port; a second gas inlet port cooperating with a second gas outlet port, wherein said first gas inlet port is adjacent said second gas outlet port and said second gas inlet port is adjacent said first gas outlet port; a first door covering one of said first gas inlet port and said second gas outlet port; a second door covering one of said second gas inlet port and said first gas outlet port; and a substrate platform positioned within said chamber to receive a substrate to be processed, herein aid first and second inlet ports and said first and second outlet ports, respectively, cooperate to provide bi-directional gas flow with respect to said substrate platform.

17. The chamber of claim 16 wherein said first door covers said first gas inlet port when said second door covers said first gas outlet port.

18. The chamber of claim 17 wherein said second door covers said second gas inlet port when said first door covers said second gas outlet port.

19. A method for bi-directional processing of a semiconductor substrate, the method comprising: loading a semiconductor substrate into a processing chamber, the processing chamber including a first gas inlet port, a second gas inlet port, a first gas outlet port, and a second gas outlet port; injecting a process gas through said chamber from said first gas inlet port for a first portion of a processing cycle; and injecting said process gas through said chamber from said second gas inlet port for a second portion of a processing cycle.

20. The method of claim 19 further comprising exhausting said process gas through said first gas outlet port during said first portion of said processing cycle, said first gas inlet port and said first gas outlet port cooperating to provide gas flow in a first direction relative to said substrate.

21. The method of claim 20 further comprising exhausting said process gas through said second gas outlet port during said second portion of said processing cycle, said second gas inlet port and said second gas outlet port cooperating to provide gas flow in a second direction relative to said substrate.

22. The method of claim 21 wherein said first direction is generally parallel to and opposite said second direction.

23. The method of claim 20 wherein said first portion of said processing cycle is equal in time to said second portion of said processing cycle.

24. The method of claim 20 wherein said first portion of said processing cycle is about one-half of said processing cycle and said second portion of said processing cycle is the remainder of said processing cycle.

25. The method of claim 20 further comprising dosing said second gas inlet port and said second gas outlet port during said first portion of said processing cycle, and dosing said first gas inlet port and said first gas outlet port during said second portion of said processing cycle.

26. The method of claim 20 further comprising injecting a partial flow of process gas from said second gas inlet port during said first portion of said processing cycle and injecting a partial flow of process gas from said first gas inlet port during said second portion of said processing cycle.

27. The method of claim 20 further comprising exhausting a partial flow of process gas through said second gas outlet port during said first portion of said processing cycle and exhausting a partial flow of process gas through said first gas outlet port during said second portion of said processing cycle.

28. The method of claim 20 wherein the substrate is stationary within said chamber during said processing cycle.

* * * * *